United States Patent
Sato et al.

(10) Patent No.: US 7,368,216 B2
(45) Date of Patent: May 6, 2008

(54) PHOTOSENSITIVE RESIN COMPOSITION AND MANUFACTURING METHOD OF SEMICONDUCTOR DEVICE USING THE SAME

(75) Inventors: Kenichiro Sato, Haibara-gun (JP); Tsukasa Yamanaka, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 11/655,905

(22) Filed: Jan. 22, 2007

(65) Prior Publication Data

US 2007/0172753 A1    Jul. 26, 2007

(30) Foreign Application Priority Data

Jan. 24, 2006  (JP)  ............................... 2006-015346

(51) Int. Cl.
*G03F 7/023* (2006.01)
*G03F 7/32* (2006.01)

(52) U.S. Cl. ...................... 430/191; 430/192; 430/193; 430/326; 430/330

(58) Field of Classification Search ................ 430/191, 430/192, 193, 326, 330
See application file for complete search history.

(56) References Cited

U.S. PATENT DOCUMENTS

| | | | |
|---|---|---|---|
| 6,518,390 B2 * | 2/2003 | Okanuma et al. | 528/176 |
| 6,780,561 B2 * | 8/2004 | Ueda et al. | 430/189 |
| 2007/0099111 A1 * | 5/2007 | Naiini et al. | 430/270.1 |

FOREIGN PATENT DOCUMENTS

| | | |
|---|---|---|
| JP | 2005-148111 A | 6/2005 |
| JP | 2005-157327 A | 6/2005 |
| JP | 2005-208527 A | 8/2005 |

* cited by examiner

*Primary Examiner*—John S. Chu
(74) *Attorney, Agent, or Firm*—Sughrue Mion, PLLC

(57) ABSTRACT

A positive photosensitive resin composition, which contains a polybenzoxazole precursor, a quinonediazide photosensitizer and a carbonate solvent, and a method of manufacturing a semiconductor device using the composition.

9 Claims, No Drawings

PHOTOSENSITIVE RESIN COMPOSITION AND MANUFACTURING METHOD OF SEMICONDUCTOR DEVICE USING THE SAME

BACKGROUND OF THE INVENTION

1. Field of the Invention

The present invention relates to a photosensitive resin composition, and more specifically relates to a positive photosensitive resin composition suitable for application to the field of microelectronics, and capable of development with an alkali aqueous solution, and a manufacturing method of a semiconductor device using the composition.

2. Description of the Related Art

In the application of microelectronics, polymers that show durability at high temperature are generally well known. The precursors of such polymers, e.g., polyimide and polybenzoxazole (PBO), can be made photo-reactive with proper additives. The precursors are converted to desired polymers by known techniques such as exposure to high temperature. Accordingly, polymer precursors are used for the manufacture of a protective layer, a thermal insulating layer, and a highly heat resisting polymer relief structure.

JP-A-2005-157327 (the term "JP-A" as used herein refers to an "unexamined published Japanese patent application") discloses a positive photosensitive resin composition containing an alkali-soluble resin, a diazoquinone compound, and γ-butyrolactone and propylene glycol monoalkyl ether as solvents in sum total of both solvents of 70 mass % or more as a composition excellent in sensitivity, prevention of scumming, and film thickness uniformity.

With respect to a photosensitive heat resistive resin composition used as the protective film of a semiconductor, JP-A-2005-148111 discloses in Example 2 that the uniformity of a coated film thickness is improved by the use of a mixed solvent comprising γ-butyrolactone and ethyl lactate.

JP-A-2005-208527 discloses, as a photosensitive coating resin composition having excellent lithographic characteristics and high preservation stability, a composition containing an organic solvent containing 10 mass % or more glycol ethers having specific benzene rings together with specific polyamide and a photosensitizer.

Photosensitive compositions containing these PBO precursors are compositions difficult to obtain sufficient difference in dissolution speed between an unexposed area and an exposed area, so that there remain various problems unsolved such as the uniformity of film thickness after development and curing.

SUMMARY OF THE INVENTION

An object of the invention is to provide a photosensitive resin composition capable of manufacturing a heat resisting relief structure, having high sensitivity, and excellent in in-plane uniformity after development and heat curing, and another object is to provide a method of manufacturing a semiconductor device using the composition.

The above objects have been achieved by the following constitutions.

(1) A positive photosensitive resin composition, which comprises:
 a polybenzoxazole precursor;
 a quinonediazide photosensitizer; and
 a carbonate solvent.

(2) The positive photosensitive resin composition as described in (1) above, which further comprises at least one of alkyl lactate and propylene glycol monoalkyl ether.

(3) The positive photosensitive resin composition as described in (1) or (2) above,
 wherein the polybenzoxazole precursor has a structure represented by formula (A1-1):

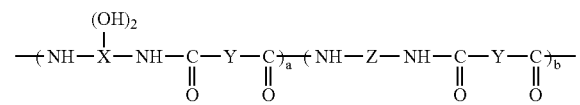

Y:

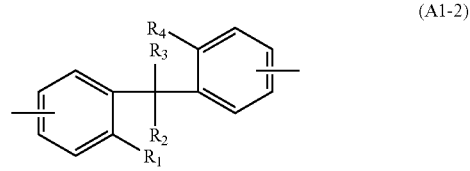

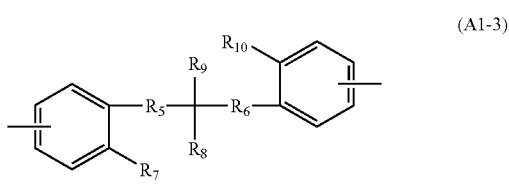

Z:

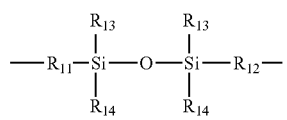

wherein X represents a tetravalent organic group represented by formula (A1-4);

Y represents a divalent organic group represented by formula (A1-2) or (A1-3);

in formulae (A1-2) and (A1-3), $R_1$, $R_2$, $R_3$ and $R_4$ each independently represents a hydrogen atom or an organic group having from 1 to 4 carbon atoms, at least one pair of $R_1$ and $R_2$, and $R_3$ and $R_4$, may form a cyclic structure by a combination of a divalent organic group having from 1 to 4 carbon atoms that may contain a group selected from —O—, —S— and >C=O, and the cyclic structure formed by $R_1$ and $R_2$ and the cyclic structure formed by $R_3$ and $R_4$ may be the same or different;

$R_5$ and $R_6$ each independently represents a group selected from a divalent organic group having from 1 to 3 carbon atoms, —O— and —S—;

$R_7$, $R_8$, $R_9$ and $R_{10}$ each independently represents a hydrogen atom or an organic group having from 1 to 4 carbon atoms, at least one pair of $R_7$ and $R_8$, and $R_9$ and $R_{10}$, may form a cyclic structure by a combination of a divalent organic group having from 1 to 4 carbon atoms that may contain a group selected from —O—, —S— and >C=O, and the cyclic structure formed by $R_7$ and $R_8$ and the cyclic structure formed by $R_9$ and $R_{10}$ may be the same or different;

in the group represented by Z, $R_{11}$ and $R_{12}$ each independently represents a divalent organic group;

$R_{13}$ and $R_{14}$ each independently represents a monovalent organic group;

a and b each independently represents a molar fraction, a+b is 100 mol %, a is from 60 to 100 mol %, and b is from 0 to 40 mol %;

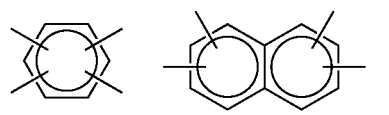
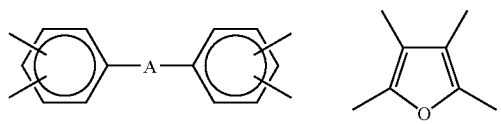
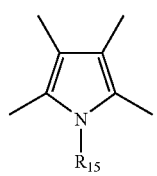

(A1-4)

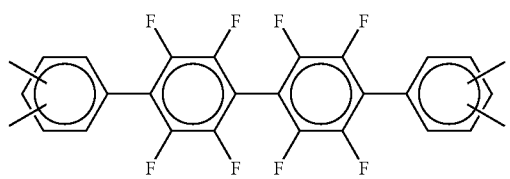

in formula (A1-4), A represents a single bond, —CH$_2$—, —C(CH$_3$)$_2$—, —O—, —S—, —SO$_2$—, —CO—, —NHCO— or —C(CF$_3$)$_2$—; and $R_{15}$ represents a hydrogen atom, an alkyl group, an alkyl ester group or a halogen atom.

(4) The positive photosensitive resin composition as described in (1) or (2) above, wherein the polybenzoxazole precursor has a structure represented by formula (A2-1):

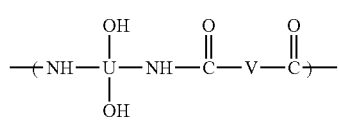

(A2-1)

wherein U represents a tetravalent organic group having an aromatic ring; and

V represents a divalent organic group, and at least one of U and V is a structure represented by formula (A2-2):

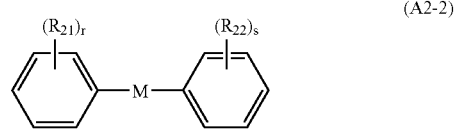

(A2-2)

wherein M represents a single bond or a divalent group;

$R_{21}$ and $R_{22}$ each independently represents a fluorine atom or a monovalent organic group;

r and s each independently represents an integer of from 1 to 4; and all the bonding hands on the structure to the amido groups or OH groups in formula (A2-1) are present on the aromatic rings.

(5) The positive photosensitive resin composition as described in (4) above, wherein the structure represented by formula (A2-2) is a structure represented by formula (A2-3):

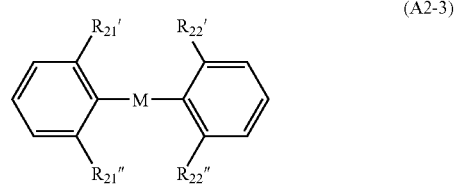

(A2-3)

wherein $R_{21}'$, $R_{21}''$, $R_{22}'$ and $R_{22}''$ each independently represents a hydrogen atom, a fluorine atom or a monovalent organic group, provided that at least one of $R_{21}'$ and $R_{21}''$ and at least one of $R_{22}'$ and $R_{22}''$ each independently represents a fluorine atom or a monovalent organic group.

(6) The positive photosensitive resin composition as described in (1) or (2) above, wherein the polybenzoxazole precursor has a structure represented by formula (A3-1):

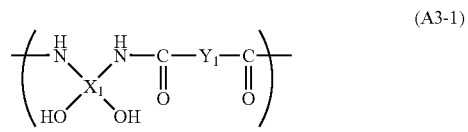

(A3-1)

wherein $X_1$ represents a tetravalent organic group having an aromatic ring;

$Y_1$ represents a divalent organic group;

two OH's and two NH's bonding to $X_1$ are each a set consists of one OH and one NH, and OH and NH in each set are positioned on ortho positions with respect to each other of the aromatic ring, and a total number of the aromatic rings contained in $X_1$ and $Y_1$ is 3 or less.

(7) The positive photosensitive resin composition as described in (6) above, wherein the polybenzoxazole precursor has a structure represented by formula (A3-2):

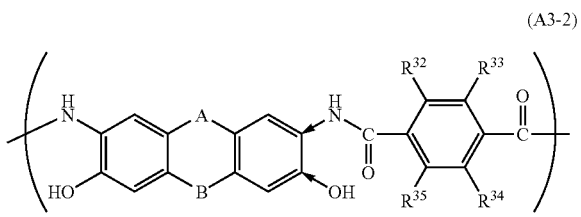
(A3-2)

wherein A and B each independently represents a divalent linking group that does not conjugate with the benzene ring to which A or B is bonded, or a single bond;

$R^{32}$, $R^{33}$, $R^{34}$ and $R^{35}$ each independently represents a monovalent group, and the bonds shown by two arrows mean that the bonds may be bonded inversely.

(8) The positive photosensitive resin composition as described in any of (1) to (7) above, which further comprises an adhesion accelerator.

(9) A method of manufacturing a semiconductor device, the method comprising:

coating a photosensitive resin composition as described in any of (1) to (8) above on a semiconductor element, so as to form a coated semiconductor element;

prebaking the coated semiconductor element, so as to form a prebaked semiconductor element;

exposing and developing the prebaked semiconductor element, so as to form a relief pattern; and curing the relief pattern.

DETAILED DESCRIPTION OF THE INVENTION

[1] Polybenzoxazole Precursor (A):

As a polybenzoxazole precursor (PBO precursor) contained in the photosensitive resin composition in the invention, known precursors such as those disclosed in U.S. Pat. No. 4,371,685 and JP-T-2002-526795 (the term "JP-T" as used herein refers to a "published Japanese translation of a PCT application") can be used, e.g., polybenzoxazole precursor polymer (G) having a structure shown below can be exemplified.

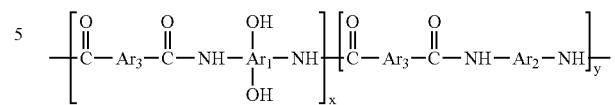
(G)

In formula (G), $Ar_1$ represents a tetravalent aromatic group, aliphatic group, heterocyclic group, or mixed group of these groups; $Ar_2$ represents a divalent aromatic group, heterocyclic group, alicyclic group, or aliphatic group, which may or may not contain silicon according to cases; $Ar_3$ represents a divalent aromatic group, aliphatic group, heterocyclic group, or mixed group of these groups; x represents from 5 to 1,000; and y represents from 0 to 900.

The intrinsic viscosity of PBO precursor at 25° C. in concentration of 0.5 g/dL measured in NMP is preferably from 0.1 to 0.7 dL/g, and more preferably from 0.12 to 0.6 dL/g.

PBO precursors have the degree of polymerization of generally from 10 to 1,000, and synthesized by the reaction of the following monomers (A), (B) and (C) in the presence of a base.

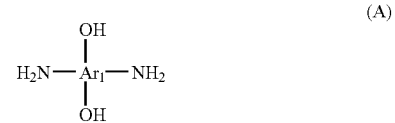
(A)

(B)

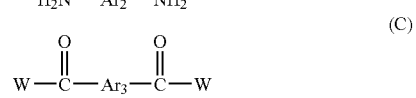
(C)

In the formulae, $Ar_1$, $Ar_2$, $Ar_3$, x and y are as defined above; W represents Cl, OR or OH; R represents an alkyl group or a cycloalkyl group, e.g., —$CH_3$, —$C_2H_5$, n-$C_3H_7$, i-$C_3H_7$, n-$C_4H_9$, t-$C_4H_9$, or cyclohexyl.

The ratio of [(A)+(B)]/(C) is generally between about 0.9 and 11. Monomer (A) is about 10 to 100 mol % of [(A)+(B)], and monomer (B) is about 0 to 90 mol % of [(A)+(B)].

PBO precursor (F) obtained by reacting the above polymer (G) and diazoquinone to partially cap the hydroxyl groups with the diazoquinone can be used in the invention.

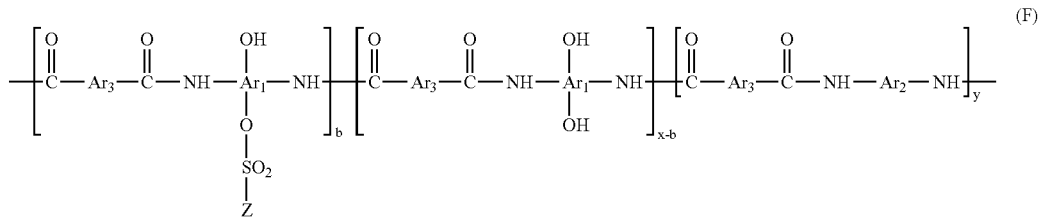
(F)

In formula (F), $Ar_1$, $Ar_2$ and $Ar_3$ are as defined above; x represents from 5 to 1,000; y represents from 0 to 900; b represents from 0 to 50; and Z represents any of the following groups.

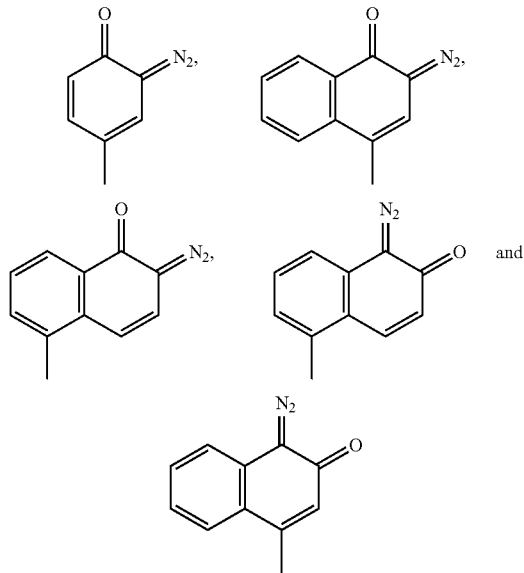

For example, it is possible that by reacting with about 1 to 35 mol % of diazoquinone, x is from 10 to 1,000, y from 0 to 900, and b is from 0.10 to 350.

In monomer (A) that is the constituent of polymer (G) and polymer (F), $Ar_1$ represents a tetravalent aromatic group, aliphatic group, or heterocyclic group, and the following groups can be exemplified.

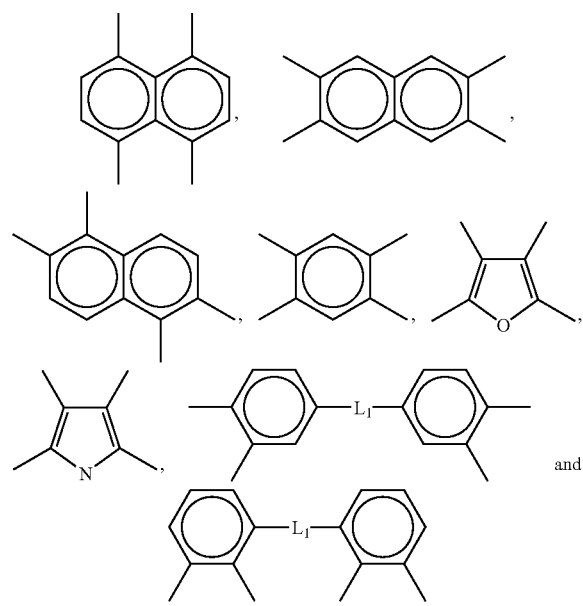

In the above formulae, $L_1$ represents —O—, —S—, —C(CF$_3$)$_2$—, —CH$_2$—, —SO$_2$—, —NHCO—, or the following group.

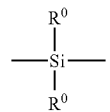

In the above formula, $R^0$ each independently represents an alkyl group or a cycloalkyl group (e.g., —CH$_3$, —C$_2$H$_5$, n-C$_3$H$_7$, i-C$_3$H$_7$, n-C$_4$H$_9$, t-C$_4$H$_9$, or cyclohexyl).

$Ar_1$ is not restricted to these groups. Monomer (A) may be a mixture of two or more monomers.

In monomer (B) that is the constituent of precursor (G) and capped precursor (F), $Ar_2$ represents a divalent aromatic group, heterocyclic group, alicyclic group, or aliphatic group, which may or may not contain silicon.

The examples of monomer (B) containing $Ar_2$ include, e.g., 5(6)-diamino-1-(4-aminophenyl)-1,3,3-trimethylindane (DAPI), m-phenylenediamine, p-phenylenediamine, 2,2'-bis(trifluoromethyl)-4,4'-diamino-1,1'-biphenyl, 3,4'-diaminodiphenyl ether, 4,4'-diaminodiphenyl ether, 3,3'-diaminodiphenyl ether, 2,4-tolylenediamine, 3,3'-diaminodiphenylsulfone, 3,4'-diaminodiphenylsulfone, 4,4'-diaminodiphenylsulfone, 3,3'-diaminodiphenylmethane, 4,4'-diaminodiphenylmethane, 3,4'-diaminodiphenylmethane, 4,4'-diaminodiphenyl ketone, 3,3'-diaminodiphenyl ketone, 3,4'-diaminodiphenyl ketone, 1,3-bis(4-aminophenoxy)benzene, 1,3-bis(3-aminophenoxy)-benzene, 1,4-bis(γ-aminopropyl)tetramethyldisiloxane, 2,3,5,6-tetramethyl-p-phenylenediamine, m-xylylenediamine, p-xylylenediamine, methylenediamine, tetramethylenediamine, pentamethylenediamine, hexamethylenediamine, 2,5-dimethylhexamethylenediamine, 3-methoxyhexamethylenediamine, heptamethylenediamine, 2,5-dimethylheptamethylenediamine, 3-methylheptamethylenediamine, 4,4-dimethylheptamethylenediamine, octamethylenediamine, nonamethylenediamine, 2,5-dimethylnonamethylenediamine, docamethylenediamine, ethylenediamine, propylenediamine, 2,2-dimethylpropylenediamine, 1,10-diamino-1,10-dimethyldecane, 2,11-diaminododecane, 1,12-diaminooctadecane, 2,17-diaminoeicosane, 3,3'-dimethyl-4,4'-diaminodiphenylmethane, bis(4-aminocyclohexyl)methane, 3,3'-diaminodiphenylethane, 4,4'-diaminodiphenylethane, 4,4'-diaminodiphenyl sulfide, 2,6-diaminopyridine, 2,5-diaminopyridine, 2,6-diamino-4-trifluoromethylpyridine, 2,5-diamino-1,3,4-oxadiazole, 1,4-diaminocyclohexane, piperazine, 4,4'-methylenedianiline, 4,4'-methylenedi-bis(o-chloroaniline), 4,4'-methylene-bis-(3-methylaniline), 4,4'-methylene-bis(2-ethylaniline), 4,4'-methylene-bis(2-methoxyaniline), 4,4'-oxy-dianiline, 4,4'-oxy-bis(2-methoxyaniline), 4,4'-oxy-bis(2-chloroaniline), 4,4'-thio-dianiline, 4,4'-thio-bis(2-methylaniline), 4,4'-thio-bis(2-methoxyaniline), 4,4'-thio-bis-(2-chloroaniline), 3,3'-sulfonyl-dianiline, 3,3'-sulfonyl-dianiline, and mixtures thereof, but the invention is not restricted thereto. However, it should be construed that monomer (B) is not restricted thereto.

In monomer (C) that is the constituent of PBO precursor (G) and capped precursor (F), $Ar_3$ represents a divalent aromatic group, aliphatic group or heterocyclic group, and, e.g., the following groups are exemplified.

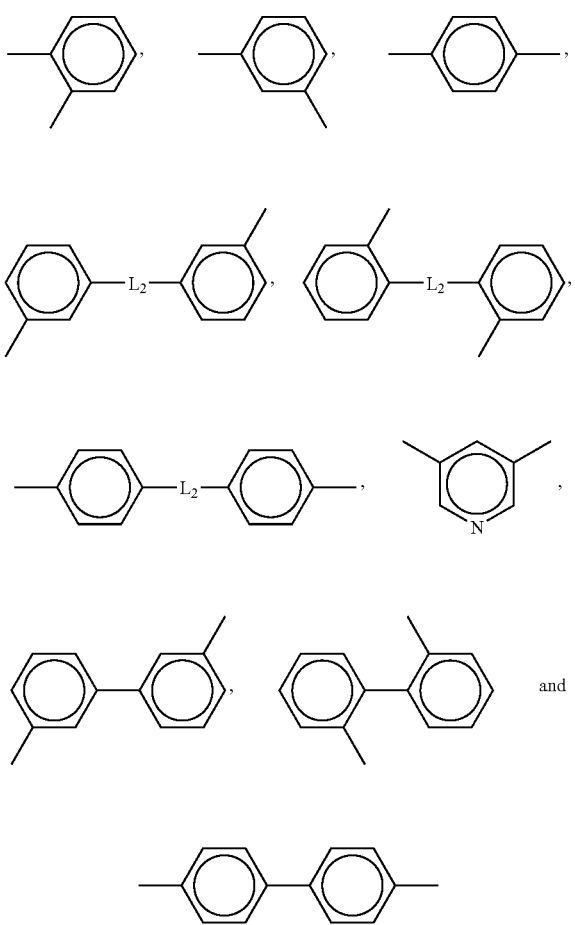

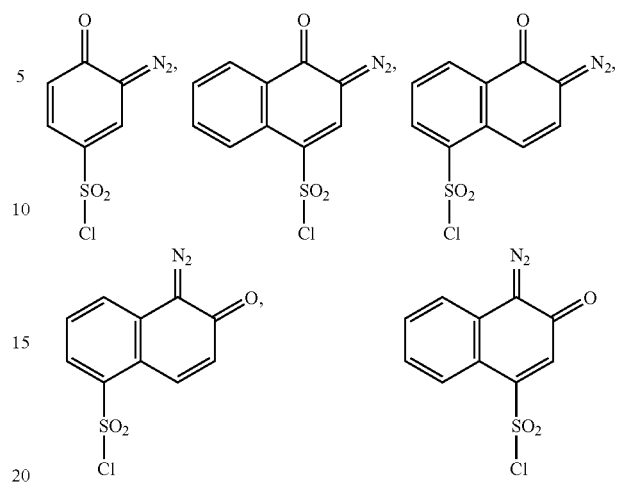

In the formulae, L$_2$ represents —O—, —S—, —C(CF$_3$)$_2$—, —CH$_2$—, —SO$_2$— or —NHCO—.

Ar$_3$ is not restricted to these groups. Monomer (C) may be a mixture of two or more monomers.

As the dizoquinone compounds that are reacted with PBO precursor (G), e.g., the following compounds are exemplified, and two or more dizoquinone compounds may be used.

The examples of preferred reaction solvents include N-methyl-2-pyrrolidone (NMP), γ-butyrolactone (GBL), N,N-dimethylformamide (DMF), N,N-dimethylacetamide (DMAc), dimethyl-2-piperidone, dimethyl sulfoxide (DMSO), sulforan, and diglyme. The most preferred examples are N-methyl-2-pyrrolidone (NMP) and γ-butyrolactone (GBL). For reacting a dicarboxylic acid or the chloride or ester thereof with at least one aromatic and/or heterocyclic dihydroxydiamine, and in some case for reacting with at least one diamine, conventionally used reaction may be used arbitrarily. The examples of the preferred dicarboxylic acids are selected from the group consisting of a 4,4'-diphenyl ether dicarboxylic acid, a terephthalic acid, an isophthalic acid, and mixtures of these acids. The examples of preferred dihydroxydiamine compounds include 3,3'-dihydroxy-4,4'-diaminodiphenyl ether, 3,3'-dihydroxybenzidine, hexafluoro-2,2-bis-3-amino-4-hydroxyphenylpropane, and mixtures of these compounds. The reaction is generally carried out at about −10 to about 30° C. for about from 6 to 48 hours. The molar ratio of a dicarboxylic acid to (diamine+dihydroxydiamine) is about 0.9 to 1.1/1.

A capped PBO precursor can be manufactured according to the following reaction.

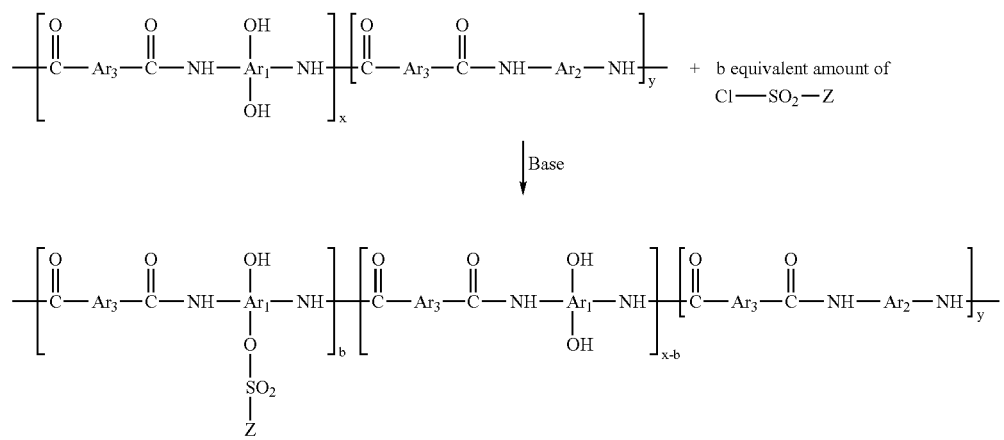

In the formulae, Z has the same meaning as described above.

Preferred arbitrary methods can be used for reacting polybenzoxazole with photoactive moiety Cl—SO$_2$-Z. The reaction is generally carried out in the presence of a base, e.g., pyridine, trialkylamine, methylpyridine, lutidine, or n-methylmorpholine at about 0 to about 30° C. for about 3 to 24 hours. The most preferred base is triethylamine.

The ratio of b/x is generally from 0.01 to 0.35, preferably from 0.02 to 0.20, and most preferably from 0.03 to 0.05.

The addition amount of PBO precursor is generally from 50 to 99 mass % to the total solids content of the photosensitive resin composition of the invention (the total amount of the components constituting the finally obtained cured product excluding solvents), and preferably from 60 to 95 mass %. (In this specification, mass ratio is equal to weight ratio.)

As a preferred PBO precursor, a PBO precursor represented by any of formulae (A1-1), (A2-1) and (A3-1) can be exemplified. (A1) PBO precursor represented by formula (A1-1):

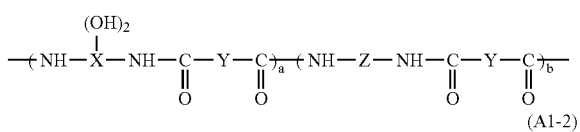

(A1-1)

Y:

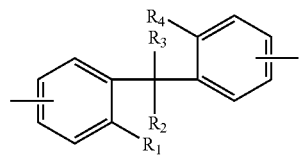

(A1-2)

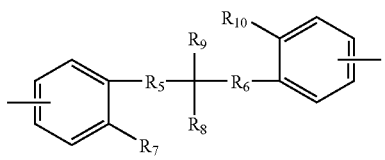

(A1-3)

Z:

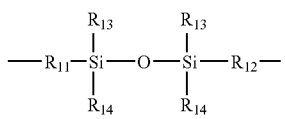

X represents a tetravalent organic group represented by formula (A1-4) shown below.

Y represents a divalent organic group represented by formula (A1-2) or (A1-3).

In formulae (A1-2) and (A1-3), $R_1$, $R_2$, $R_3$ and $R_4$ each independently represents a hydrogen atom or an organic group having from 1 to 4 carbon atoms, $R_1$ and $R_2$ and/or $R_3$ and $R_4$ may form a cyclic structure by the combination of divalent organic groups having from 1 to 4 atoms that may contain a group selected from —O—, —S— and >C=O, and the cyclic structure formed by $R_1$ and $R_2$ and the cyclic structure formed by $R_3$ and $R_4$ may be the same or different.

$R_5$ and $R_6$ each independently represents a group selected from a divalent organic group having from 1 to 3 carbon atoms, —O— and —S—.

$R_7$, $R_8$, $R_9$ and $R_{10}$ each independently represents a hydrogen atom or an organic group having from 1 to 4 carbon atoms, $R_7$ and $R_8$ and/or $R_9$ and $R_{10}$ may form a cyclic structure by the combination of divalent organic groups having from 1 to 4 carbon atoms that may contain a group selected from —O—, —S— and >C=O, and the cyclic structure formed by $R_7$ and $R_8$ and the cyclic structure formed by $R_9$ and $R_{10}$ may be the same or different.

In the group represented by Z, $R_{11}$ and $R_{12}$ each independently represents a divalent organic group, $R_{13}$ and $R_{14}$ each independently represents a monovalent organic group, a and b each independently represents a molar fraction, a+b is 100 mol %, a is from 60 to 100 mol %, and b is from 0 to 40 mol %.

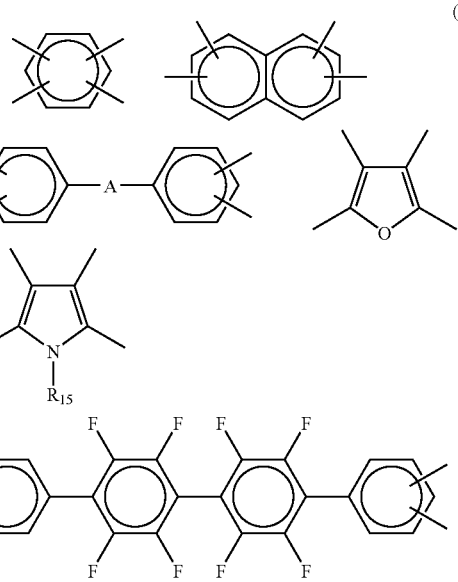

(A1-4)

In formula (A1-4), A represents a single bond, —CH$_2$—, —C(CH$_3$)$_2$—, —O—, —S—, —SO$_2$—, —CO—, —NHCO— or —C(CF$_3$)$_2$—.

$R_{15}$ represents a hydrogen atom, an alkyl group, an alkyl ester group or a halogen atom.

A polyamide resin containing a structure represented by formula (A1-1) is a resin obtained by the reaction of bis(aminophenol) having the structure of X and a dicarboxylic acid having the structure of Y or a compound selected from dicarboxylic acid dichloride and dicarboxylic acid derivative. In the case of the dicarboxylic acid, for the purpose of increasing the reaction yield, a dicarboxylic acid derivative of an active ester type reacted in advance with 1-hydroxy-1,2,3-benzotriazole, etc., may be used.

3,3'-Diamino-4,4'-dihydroxybiphenyl is especially preferred as X in formula (A1-1). According to the structure, the resin structure after curing has linearity, and the coefficient of linear expansion of a cured film becomes small and approaches the coefficient of linear expansion of an Si wafer, so that the warp of an Si wafer is little.

As Y in formula (A1-1), the following specific examples can be exemplified, but the invention is not restricted thereto.

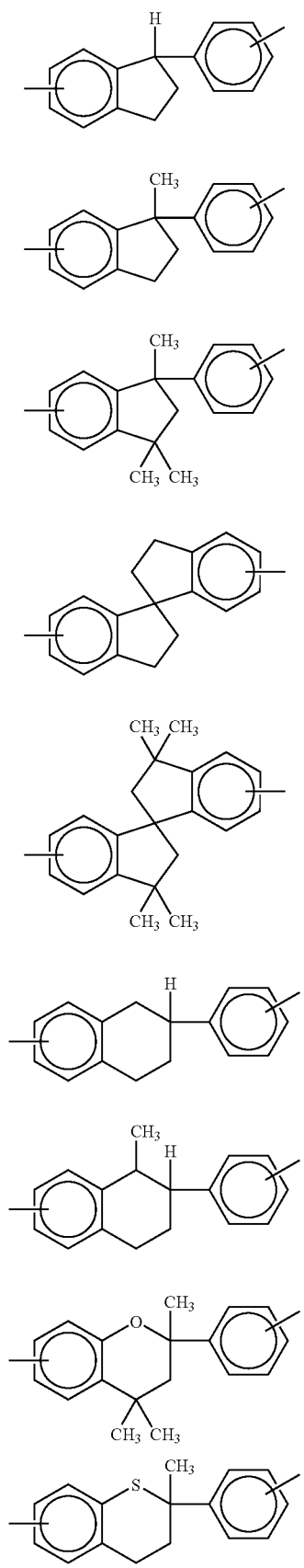

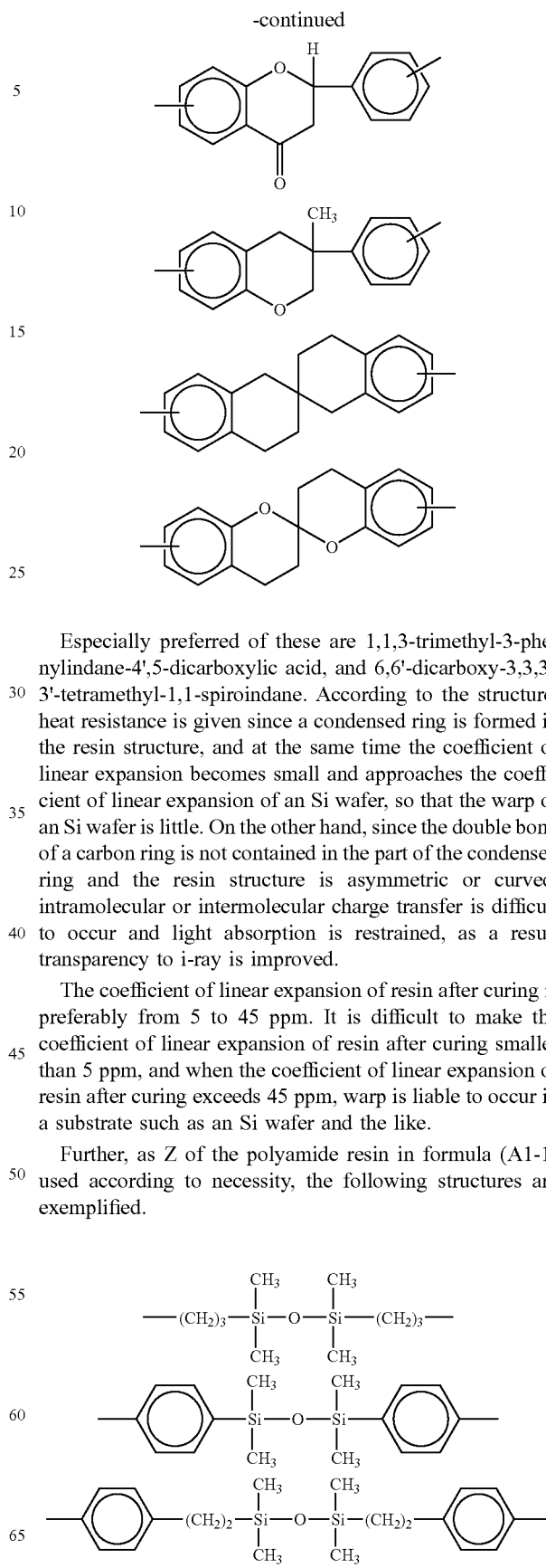

Especially preferred of these are 1,1,3-trimethyl-3-phenylindane-4',5-dicarboxylic acid, and 6,6'-dicarboxy-3,3,3',3'-tetramethyl-1,1-spiroindane. According to the structure, heat resistance is given since a condensed ring is formed in the resin structure, and at the same time the coefficient of linear expansion becomes small and approaches the coefficient of linear expansion of an Si wafer, so that the warp of an Si wafer is little. On the other hand, since the double bond of a carbon ring is not contained in the part of the condensed ring and the resin structure is asymmetric or curved, intramolecular or intermolecular charge transfer is difficult to occur and light absorption is restrained, as a result transparency to i-ray is improved.

The coefficient of linear expansion of resin after curing is preferably from 5 to 45 ppm. It is difficult to make the coefficient of linear expansion of resin after curing smaller than 5 ppm, and when the coefficient of linear expansion of resin after curing exceeds 45 ppm, warp is liable to occur in a substrate such as an Si wafer and the like.

Further, as Z of the polyamide resin in formula (A1-1) used according to necessity, the following structures are exemplified.

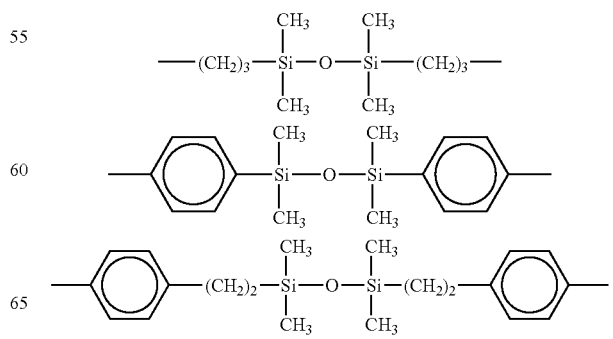

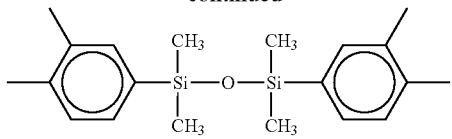

Z in formula (A1-1) is used, for example, when especially excellent adhesion to a substrate such as an Si wafer is required, and the maximum use proportion b is 40 mol %. When the use proportion exceeds 40 mol %, the solubility of the resin extremely lowers and development residue (scum) is generated, so that pattern processing is infeasible and not preferred. In using X, Y and Z, for increasing the solubility in an organic solvent, it is possible to copolymerize a mixture of two or more kinds within a degree that the coefficient of linear expansion of the resin is not too great.

In the invention, from the viewpoint of preservation stability, it is preferred to cap terminals. For capping terminals, an aliphatic group having at least one alkenyl group or alkynyl group or a derivative having a cyclic compound group can be introduced to the terminals of polyamide represented by formula (A1-1) as acid derivative and amine derivative. Specifically, for example, after synthesizing a polyamide resin containing a structure represented by formula (A1-1) by the reaction of bis (aminophenol) having the structure of X and dicarboxylic acid having the structure of Y, or a compound selected from dicarboxylic acid dichloride and dicarboxylic acid derivative, it is preferred to cap the terminal amino group contained in the polyamide resin with an acid anhydride or an acid derivative containing an aliphatic group or a cyclic compound group having at least one alkenyl group or alkynyl group as amide. As the groups originating in the acid anhydride or acid derivative containing the aliphatic group or cyclic compound group having at least one alkenyl group or alkynyl group after reaction with the amino group, e.g., the following structures are exemplified.

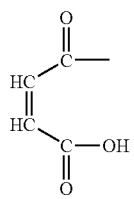 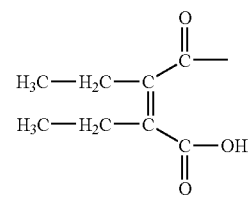

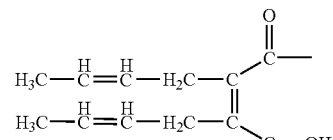

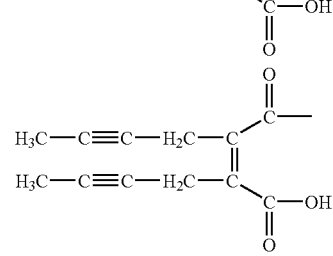

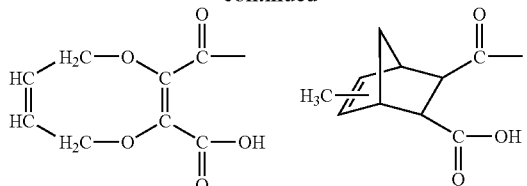

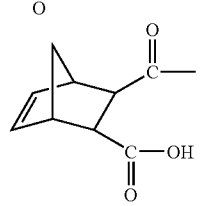

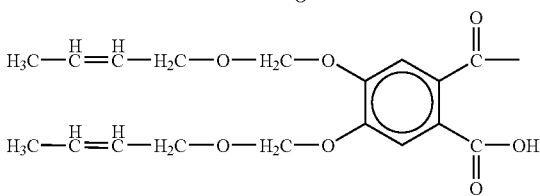

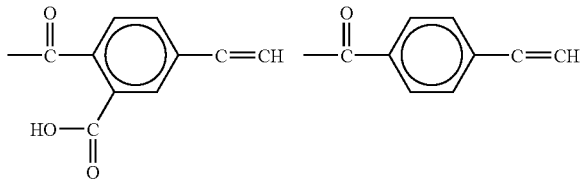

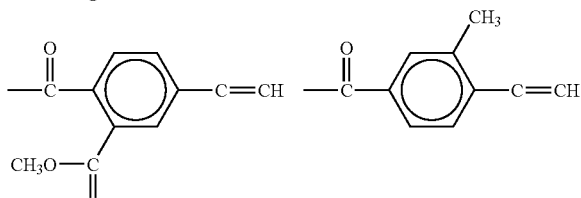

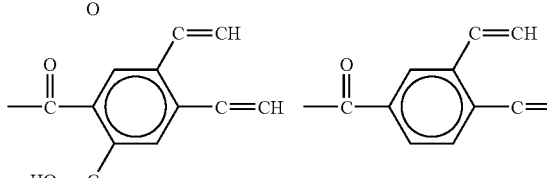

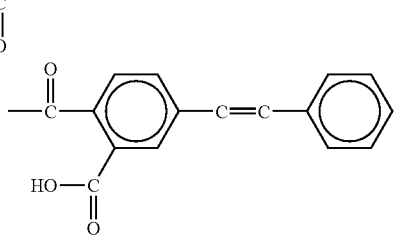

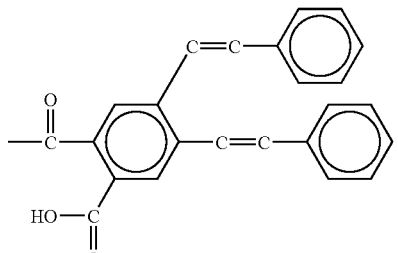

Of these structures, the following structures are especially preferred.

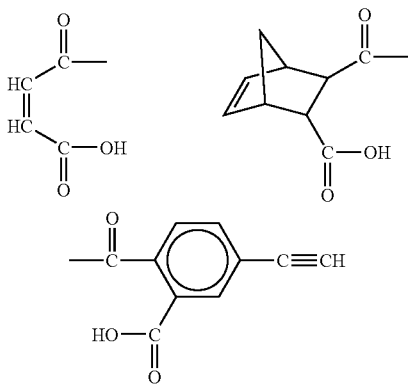

These structures may be used in combination of two or more. Further, the invention is not restricted to the above method, and the terminal acid contained in the polyamide resin can also be capped with an amine derivative containing an aliphatic group or a cyclic compound group having at least one alkenyl group or alkynyl group as amide.

(A2) Polybenzoxazole Precursor Represented by Formula (A2-1):

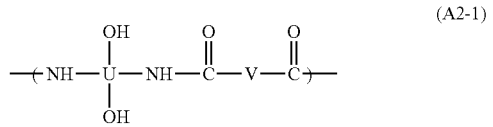

(A2-1)

In formula (A2-1), U represents a tetravalent organic group, and V represents a divalent organic group, and at least one of U and V is a structure represented by the following formula (A2-2):

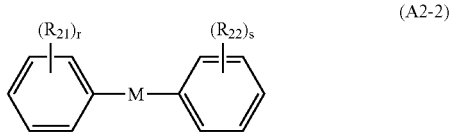

(A2-2)

In formula (A2-2), M represents a single bond or a divalent group; $R_{21}$ and $R_{22}$ each independently represents a fluorine atom or a monovalent organic group; and r and s each independently represents an integer of from 1 to 4.

All the bonding hands on the structure to the amido group or OH group in formula (A2-1) are present on the aromatic rings.

In the invention, the tetravalent organic group represented by U in formula (A2-1) is generally a diamine residue having a structure that each of two hydroxyl groups reacting with dicarboxylic acid and forming a polyamide structure is positioned on the ortho-position of the amine. On the other hand, the divalent organic group represented by V in formula (A2-1) is generally a dicarboxylic acid residue forming a polyamide structure by reacting with diamine.

As the examples of the divalent groups represented by M, —$CH_2$—, —$C(CH_3)_2$—, —O—, —S—, —$SO_2$—, —CO—, —$(CF_3)_2$—, etc., are preferably exemplified. From the aspect of stress, a single bond is most preferred.

As the examples of the monovalent organic groups represented by $R_{21}$, and $R_{22}$, an alkyl group, an alkyl ether group, a fluoroalkyl group, and a fluoroalkyl ether group, each group having from 1 to 10 carbon atoms, are preferably exemplified. As the integers represented by r and s, each preferably represents 1 or 2. The bonding positions of the groups are preferably the ortho-positions to M in the points of transparency and the like.

The structure represented by formula (A2-2) is preferably a structure represented by the following formula (A2-3).

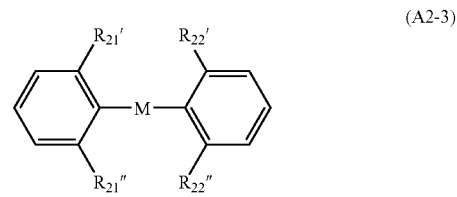

(A2-3)

In formula (A2-3), $R_{21}'$, $R_{21}''$, $R_{22}'$ and $R_{22}''$ each independently represents a hydrogen atom, a fluorine atom, or a monovalent organic group (an alkyl group, an alkyl ether group, a fluoroalkyl group, a fluoroalkyl ether group, etc., each having from 1 to 10 carbon atoms). At least one of $R_{21}'$ and $R_{21}''$, and at least one of $R_{22}'$ and $R_{22}''$ represent a fluorine atom or a monovalent organic group, and more preferably a monovalent organic group.

For the reason of capable of obtaining a polymer of low stress and high transparency, M most preferably represents a single bond, and $R_{21}'$, $R_{21}''$, $R_{22}'$ and $R_{22}''$ each preferably represents a methyl group, a trifluoromethyl group, an ethyl group, an isopropyl group, or a t-butyl group.

As diamine components to provide the structure represented by formula (A2-2) (including the structure represented by formula (A2-3)), 2,2'-bis(trifluoromethyl)-bis(3-hydroxy-4-amino)biphenyl, 2,2'-dimethyl-bis(3-hydroxy-4-amino)biphenyl, and bis(3-amino-4-hydroxy-6-methylphenyl)sulfone are exemplified, and as similar dicarboxylic acids, 2,2'-dimethyl-4,4'-biphenylcarboxylic acid, 2,2'-bis(trifluoromethyl)-4,4'-biphenylcarboxylic acid, 4,4'-dicarboxy-2,2'-dimethyldiphenyl ether, etc., are exemplified.

It is sufficient for the aromatic polyamide having the repeating unit represented by formula (A2-1) for use in the invention to have a structure represented by formula (A2-2), but may have other structures of U or V. These are the structures other than the structure represented by formula (A2-2), and a divalent or tetravalent aromatic group or aliphatic group having from 4 to 40 carbon atoms is preferred, and a divalent or tetravalent aromatic group having from 4 to 40 carbon atoms is more preferred.

As diamines to provide such U, 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl)sulfone, 2,2-bis(3-amino-4-hydroxyphenyl)-1,1,1,3,3,3-hexafluoropropane, 2,2-bis(4-amino-3-hydroxyphenyl)-1,1,1,3,3,3-hexafluoropropane, bis(4-amino-3-hydroxyphenyl)ether, bis(3-amino-4-hydroxyphenyl)ether, etc., are exemplified. Of these compounds, the compounds preferred in the points of transparency and the like are 3,3'-diamino-4,4'-dihydroxybiphenyl, 4,4'-diamino-3,3'-dihydroxybiphenyl, bis(3-amino-4-hydroxyphenyl)propane, 2,2-bis(3-amino-4-hydroxyphenyl)-1,1,1,3,3,3-hexafluoropropane, and 2,2-bis(4-amino-3- hydroxyphenyl)-1,1,1,3,3,3-hexafluoropropane. As the compounds preferred in the point of low stress, 3,3'-diamino-4,4'-dihydroxybiphenyl, 4,4'-diamino-3,3'-dihydroxybiphenyl, and the following structures are exemplified.

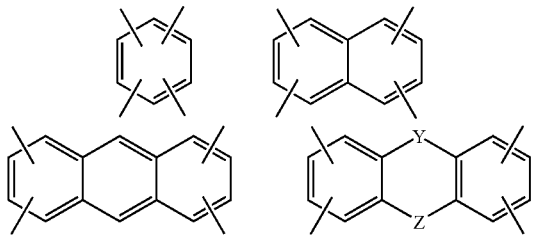

In the above, Y and Z each independently represents a single bond or a divalent group, and as the divalent group, —CH$_2$—, —C(CH$_3$)$_2$—, —O—, —S—, —SO$_2$—, —CO—, and —(CF$_3$)$_2$— are preferably exemplified.

These compounds can be used alone, or two or more in combination.

As dicarboxylic acids to give such V, aromatic dicarboxylic acids such as isophthalic acid, terephthalic acid, 2,2-bis(4-carboxyphenyl)-1,1,1,3,3,3-hexafluoropropane, 4,4'-dicarboxybiphenyl, 2,2'-dicarboxybiphenyl, 4,4'-dicarboxydiphenyl ether, 4,4'-dicarboxytetraphenylsilane, bis(4-carboxyphenyl)sulfone, 2,2-bis(p-carboxyphenyl)propane, 5-tert-butylisophthalic acid, 5-bromoisophthalic acid, 5-fluoroisophthalic acid, 5-chloroisophthalic acid, and 2,6-naphthalenedicarboxylic acid, and aliphatic dicarboxylic acids such as 1,2-cyclobutanedicarboxylic acid, 1,4-cyclohexanedicarboxylic acid, 1,3-cyclopentanedicarboxylic acid, oxalic acid, malonic acid, and succinic acid are exemplified. Of these compounds, the compounds preferred in the points of transparency and the like are 2,2-bis(4-carboxyphenyl)-1,1,1,3,3,3-hexafluoropropane, 4,4'-dicarboxydiphenyl ether, and aliphatic dicarboxylic acids.

In the point of low stress, 4,4'-dicarboxybiphenyl, 2,2'-dicarboxybiphenyl, terephthalic acid, 2,6-naphthalenedicarboxylic acid, and the following structures are preferred.

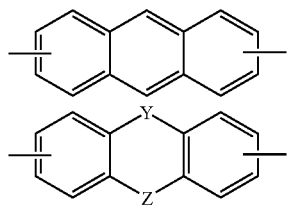

In the above, Y and Z each independently represents a single bond or a divalent group, and as the divalent group, —CH$_2$—, —C(CH$_3$)$_2$—, —O—, —S—, —SO$_2$—, —CO—, and —(CF$_3$)$_2$— are preferably exemplified.

These compounds can be used alone, or two or more in combination.

In the formulae of the polyamide, repeating units other than the repeating unit represented by formula (A2-1) may be used.

The solubility of polyamide in an alkali aqueous solution depends upon a phenolic hydroxyl group, it is preferred that an amide unit containing a hydroxyl group is contained beyond a certain proportion. In this case, polyamide represented by the following formula is preferred.

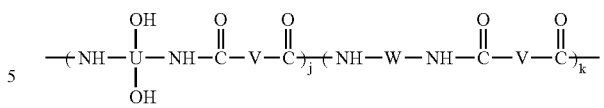

In the above formula, U represents a tetravalent organic group; V and W each independently represents a divalent organic group; j and k each independently represents a molar fraction, the sum of j and k is 100 mol %, j is from 60 to 100 mol %, and k is from 40 to 0 mol %.

Here, the molar fraction of j in the formula is preferably from 80 to 100 mol %, and of k is from 20 to 0 mol %. The divalent organic group represented by W is generally a residue of diamine reacting with dicarboxylic acid and forming a polyamide structure, which is a residue other than the diamine for forming U. The divalent organic group is preferably a divalent aromatic group or aliphatic group having from 4 to 40 carbon atoms. A divalent aromatic group having from 4 to 40 carbon atoms is more preferred.

As such diamines, aromatic diamine compounds, e.g., 4,4'-diaminodiphenyl ether, 4,4'-diaminodiphenylmethane, 4,4'-diaminodiphenylsulfone, 4,4'-diaminodiphenyl sulfide, benzidine, m-phenylenediamine, p-phenylenediamine, 1,5-naphthalenediamine, 2,6-naphthalenediamine, bis(4-aminophenoxyphenyl)sulfone, bis(3-aminophenoxyphenyl)sulfone, bis(4-aminophenoxy)biphenyl, bis[4-(4-aminophenoxy)phenyl]ether, 1,4-bis(4-aminophenoxy)benzene and the like, in addition to these, as diamines containing a silicon group, LP-7100, X-22-161AS, X-22-161A, X-22-161B, X-22-161C, and X-22-161E (trade names, manufactured by Shin-Etsu Chemical Co., Ltd.) are exemplified, but the invention is not restricted thereto. These compounds are used alone or combination of two or more.

In this case, it is preferred that W also has the structure represented by formula (A2-2).

The terminal group of the aromatic polyamide represented by formula (A2-1) becomes amine having a carboxylic acid or a phenol group by the charge ratio of U and V. If necessary, one or both terminals of a polymer may be made a saturated aliphatic group, an unsaturated aliphatic group, a carboxyl group, a phenolic hydroxyl group, a sulfonic acid group, or a thiol group by the reaction of polymer terminals with a single or two kinds of end-capping agents. At that time, end-capping rate is preferably from 30 to 100%.

The molecular weight of the PBO precursor represented by formula (A2-1) is preferably from 3,000 to 200,000 as weight average molecular weight, and more preferably from 5,000 to 100,000. The molecular weight here is a value obtained by the measurement according to gel permeation chromatography and conversion from the standard polystyrene calibration curve.

In the invention, polyamide having a repeating unit represented by formula (A2-1) can be generally synthesized from a dicarboxylic acid derivative and hydroxyl group-containing diamines. Specifically, the polyamide can be synthesized, after converting a dicarboxylic acid derivative to a dihalide derivative, by the reaction with the diamines. As the dihalide derivative, a dichloride derivative is preferred.

The dichloride derivative can be synthesized by the reaction of a dicarboxylic acid derivative with a halogenating agent. As the halogenating agent, thionyl chloride, phosphoryl chloride, phosphorus oxychloride, and phosphorus pentachloride that are used in ordinary acid chloride reaction of carboxylic acid can be used.

Dichloride derivatives can be synthesized by a method of reacting dicarboxylic acid derivative with the halogenating agent in a solvent, or by a method of performing the reaction in an excess amount of halogenating agent, and then distilling off the excess halogenating agent. As the reaction solvent, N-methyl-2-pyrrolidone, N-methyl-2-pyridone, N,N-dimethylacetamide, N,N-dimethylformamide, toluene and benzene can be used.

The use amount of the halogenating agent is preferably from 1.5 to 3.0 mol to the dicarboxylic acid derivative in the case of reaction in a solvent, more preferably from 1.7 to 2.5 mol, and from 4.0 to 50 mol in the case of reaction in a halogenating agent, and more preferably from 5.0 to 20 mol. The temperature of reaction is preferably from −10 to 70° C., and more preferably from 0 to 20° C.

The reaction of a dichloride derivative with diamines is preferably performed in an organic solvent in the presence of a dehydrohalogenating agent. As the dehydrohalogenating agent, organic bases such as pyridyl and triethylamine are generally used. Further, as the organic solvent, N-methyl-2-pyrrolidone, N-methyl-2-pyridone, N,N-dimethylacetamide, and N,N-dimethylformamide can be used. The temperature of reaction is preferably from −10 to 30° C., and more preferably from 0 to 20° C.

(A3) Polybenzoxazole Precursor Represented by Formula (A3-1):

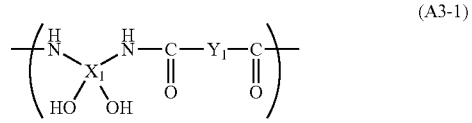

(A3-1)

In formula (A3-1), $X_1$ represents a tetravalent organic group having an aromatic ring; $Y_1$ represents a divalent organic group; two OH's and two NH's bonding to $X_1$ are each a set consists of one OH and one NH, and OH and NH in each set are positioned on the ortho positions with respect to each other of aromatic rings, and the total number of the aromatic rings contained in $X_1$ and $Y_1$ is 3 or less.

The hydroxyl group concentration of the PBO precursor represented by formula (A3-1) is preferably 3.35 mol/kg or more when not containing a fluorine atom, and the hydroxyl group concentration is preferably 2.00 mol/kg or more when containing a fluorine atom. Further, the transmittance of light of 365 nm per 10 μm of the thickness of the film formed of the PBO precursor is preferably 1% or more.

The above PBO precursor is preferably a PBO precursor having a repeating unit represented by the following formula (A3-2).

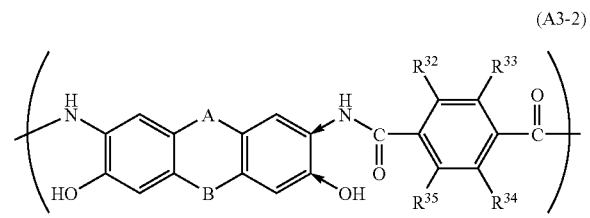

(A3-2)

In formula (A3-2), A and B each independently represents a divalent linking group that does not conjugate with the benzene ring to which A or B is bonded, or a single bond; $R^{32}$, $R^{33}$, $R^{34}$ and $R^{35}$ each independently represents a monovalent group, and the bonds shown by two arrows mean that they may be bonded inversely.

In formula (A3-1), $X_1$ represents a tetravalent organic group having an aromatic ring, which is generally a dihydroxydiamine residue forming the structure of a PBO precursor by the reaction with dicarboxylic acid. Two OH's and two NH's bonding to $X_1$ are each a set comprising one OH and one NH, and OH and NH in each set are positioned on the ortho positions of aromatic rings. As the tetravalent organic group having an aromatic ring represented by $X_1$, groups having at least one aromatic ring (e.g., a benzene ring, a naphthalene ring, etc.) and from 6 to 20 carbon atoms are exemplified, and these groups may have various substituents such as an alkyl group, an alkoxyl group, a halogen atom, and a halogenated alkyl group.

The divalent organic group represented by $Y_1$ in formula (A3-1) is generally a dicarboxylic acid residue forming the structure of a PBO precursor by reacting with dihydroxydiamine. As the divalent organic group having an aromatic ring represented by $Y_1$, groups having at least one aromatic ring (e.g., a benzene ring, a naphthalene ring, etc.) and from 6 to 20 carbon atoms are exemplified, and these groups may have various substituents. Having one aromatic ring contributes to solubility in an alkali aqueous solution and preferred.

In the repeating unit represented by formula (A3-1), the number of aromatic rings contained in $X_1$ and $Y_1$ is 3 or less. When the number of aromatic rings is 4 or more, it is difficult to reconcile low stress of the wafer and the solubility in an alkali aqueous solution. The hydroxyl group concentration of the PBO precursor in the invention is preferably 3.35 mol/kg or more when not containing a fluorine atom, preferably from 4.0 to 10.0 mol/kg, and hydroxyl group concentration is preferably 2.00 mol/kg or more when containing a fluorine atom, and preferably from 3.0 to 10.0 mol/kg. When the value is lower than this numerical value, the solubility in an alkali aqueous solution is insufficient.

The hydroxyl group concentration can be computed as the hydroxyl group content per mass of the repeating unit (the number of the hydroxyl groups/the mass of the repeating unit) on the basis of the amounts and kinds of the materials of the resin.

Further, it is preferred that the PBO precursor for use in the invention has transmittance of light of 365 nm per 10 μm of the thickness of the prebaked film formed of the PBO precursor of 1% or more, more preferably 5% or more, and still more preferably 10% or more. When the value is less than 1%, it is difficult to obtain a photosensitive resin composition capable of forming a pattern high in resolution and having a good shape. The especially preferred transmittance is from 10 to 80%. The film of a PBO precursor can be manufactured by dissolving the PBO precursor in a solvent, coating the resulting solution on a substrate, and drying to form a film. The transmittance of light of 365 nm of the film of a PBO precursor can be measured with a spectrophotometer (e.g., model U-3410, manufactured by Hitachi Limited). Even when a film thickness is not exactly 10 μm, it is possible to convert the film thickness to 10 μm according to Lambert's law.

The PBO precursor for use in the photosensitive resin composition of the invention preferably has a repeating unit represented by formula (A3-2), it is more preferred that the repeating unit represented by formula (A3-2) accounts for 50% or more of all the repeating units, still more preferably 80% or more, and especially preferably about 100%. In formula (A3-2), A and B each independently represents a divalent linking group that does not conjugate with the benzene ring to which A or B is bonded, and specifically a carbonyl group, an oxy group, a thio group, a sulfinyl group, a sulfonyl group, an alkylene group having from 1 to 5 carbon atoms that may have a substituent, an imino group that may have a substituent, a silylene group that may have a substituent, and groups formed by combination of these groups can be exemplified.

As the substituents that may be contained in each group as described in the explanation of A and B, monovalent and divalent substituents are exemplified, and specifically an alkyl group having from 1 to 10 carbon atoms that may be branched, an alkyl group having from 1 to 10 carbon atoms substituted with a halogen atom (e.g., chlorine, fluorine, iodine, bromine, etc.), an alkenyl group having from 1 to 10 carbon atoms, an alkynyl group having from 1 to 10 carbon atoms, an aromatic hydrocarbon group having from 6 to 20 carbon atoms, e.g., a phenyl group and a benzyl group, an alkyloxy group having from 1 to 10 carbon atoms, an alkyloxy group having from 1 to 10 carbon atoms substituted with a halogen atom (e.g., chlorine, fluorine, iodine, bromine, etc.), a cyano group, a halogen atom (e.g., chlorine, fluorine, iodine, bromine, etc.), a hydroxyl group, an amino group, an azido group, a mercapto group, a trialkylsilyl group in which each alkyl group has from 1 to 5 carbon atoms, an alkylene group having from 2 to 5 carbon atoms, a carbonyl group, a carboxyl group, an imino group, an oxy group, a thio group, a sulfinyl group, a sulfonyl group, a dialkylsilylene group in which each alkyl group has from 1 to 5 carbon atoms, and substituents formed by combination of these groups can be exemplified. Of these groups, an alkyl group having from 1 to 5 carbon atoms, a halogen-substituted alkyl group having from 1 to 5 carbon atoms, an alkyloxy group having from 1 to 5 carbon atoms, a halogen-substituted alkyloxy group having from 1 to 5 carbon atoms, an aromatic hydrocarbon group, and an alkylene group having 2 or 3 carbon atoms are more preferred.

For capable of improving the transparency to i-ray and reducing the stress of wafer, A and B each preferably represents a group selected from a single bond, O, $CH_2$, C=O, $Si(CH_3)_2$, $C(CH_3)_2$, $C(CF_3)_2$, $C(CH_3)(CF_3)$, $Si(OCH_3)_2$, $C(OCH_3)_2$, $C(OCF_3)_2$, $C(OCH_3)(OCF_3)$, S, $SO_2$, $CH(CH_3)$, $CH(CF_3)$, $CH(OCH_3)$, $CH(OCF_3)$, $SiH(CH_3)$ and $SiH(OCH_3)$.

As the monovalent group represented by $R^{32}$, $R^{33}$, $R^{34}$ and $R^{35}$, a group selected from a hydrogen atom, an alkyl group having from 1 to 10 carbon atoms, $CF_3$, a halogen atom, COOH and OH is preferred in view of the transparency to i-ray and the solubility in an alkali aqueous solution.

The PBO precursor for use in the invention can be synthesized by the reaction of dihydroxydiamine and dicarboxylic acid or a derivative thereof in an organic solvent used according to necessary.

As preferred dihydroxydiamine, for example, the following compounds can be exemplified.

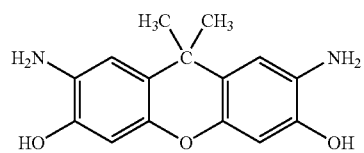

-continued

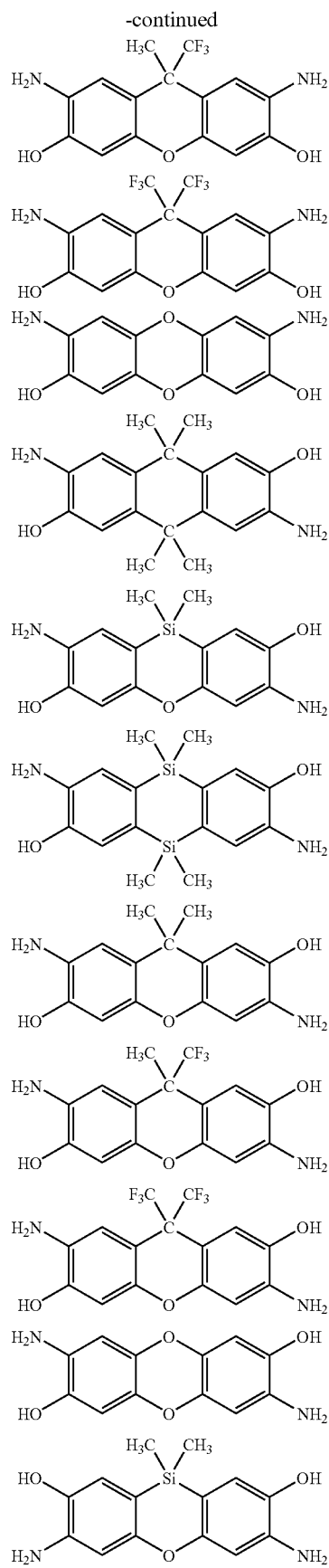

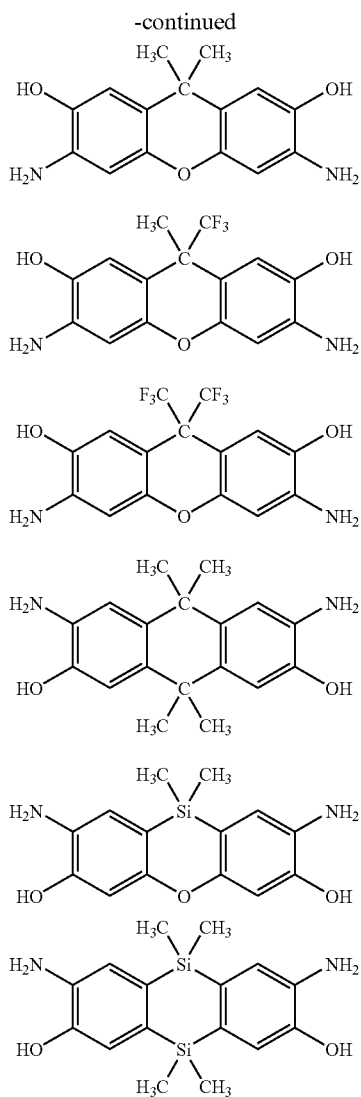

Further, diamines, e.g., 3,3'-diamino-4,4'-dihydroxydiphenyl ether, 4,4'-diamino-3,3'-dihydroxydiphenyl ether, and 2,2-bis(3-amino-4-hydroxyphenyl)hexafluoropropane can also be used.

As preferred dicarboxylic acid components, dicarboxylic acids having one benzene ring in which two carboxyl groups are bonded to the para-positions are exemplified and, for example, the following ones are preferably exemplified.

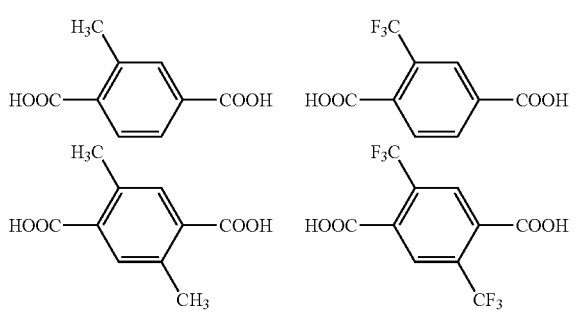

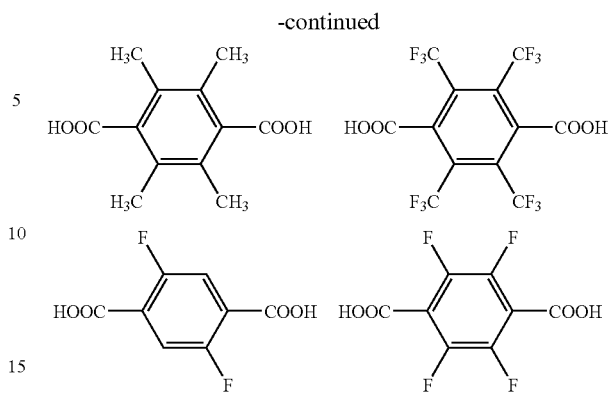

Further, for example, diphenyl ether-4,4'-dicarboxylic acid, diphenyl ether-3,3'-dicarboxylic acid, diphenyl ether-3,4'-dicarboxylic acid, benzophenone-4,4'-dicarboxylic acid, benzophenone-3,4'-dicarboxylic acid, diphenylsulfone-4,4'-dicarboxylic acid, diphenylsulfone-3,4'-dicarboxylic acid, and the following ones are exemplified.

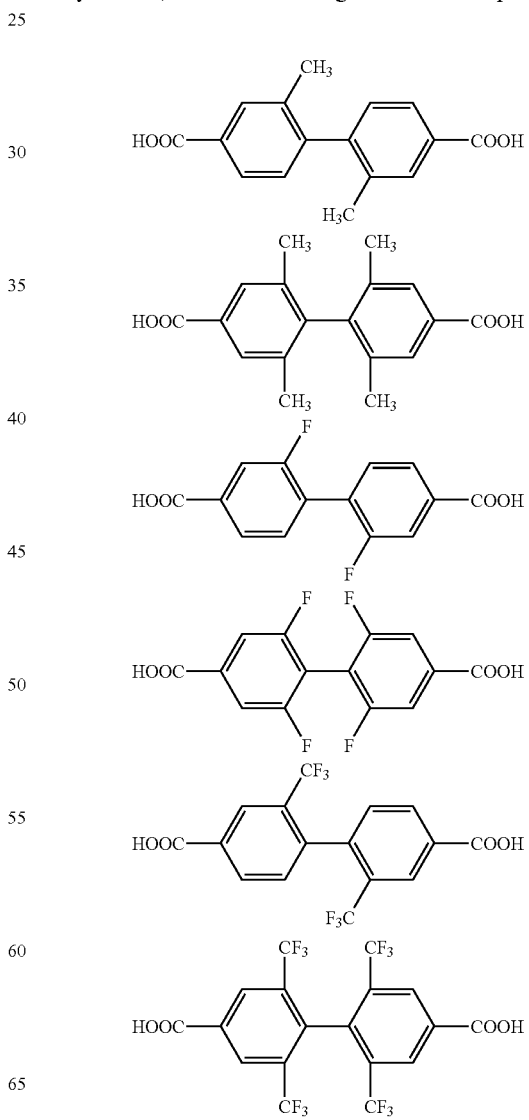

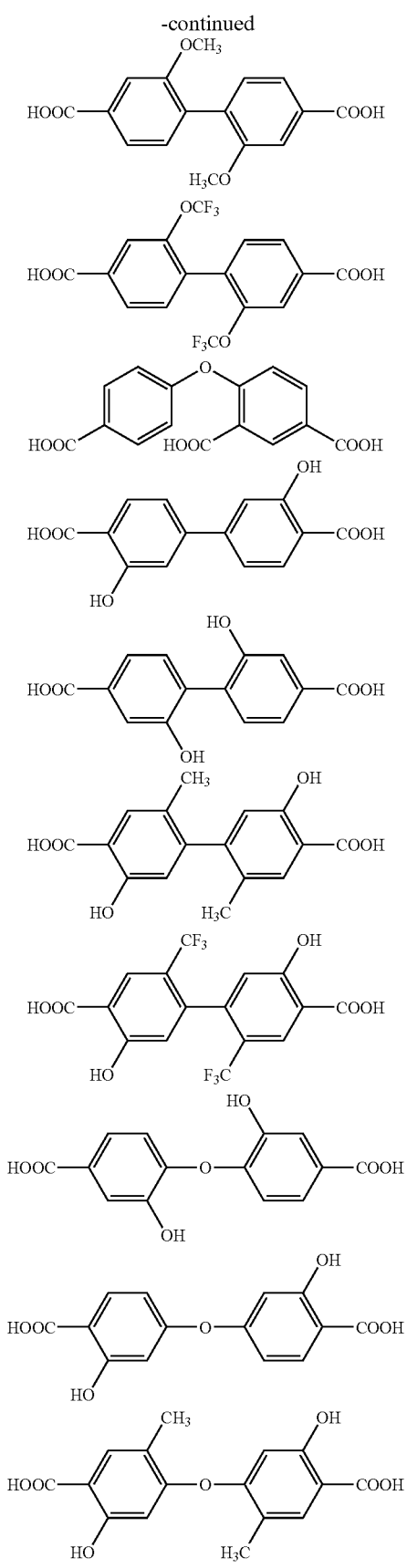

-continued

As the organic solvents for use in the above reaction, polar solvents capable of completely dissolving the PBO precursor formed are preferably used, and, e.g., N-methyl-2-pyrrolidone, N,N-dimethylacetamide, N,N-dimethylformamide, dimethyl sulfoxide, and γ-butyrolactone are exemplified.

The PBO precursor can be obtained, for example, by the reaction of dicarboxylic acid dihalide (chloride, bromide, etc.) and diamine. In this case, it is preferred to perform the reaction in an organic solvent in the presence of a dehalogenating acid catalyst. As the dicarboxylic acid dihalide, dicarboxylic acid dichloride is preferred. The dicarboxylic acid dichloride can be obtained by the reaction of dicarboxylic acid and thionyl chloride.

The molecular weight of the PBO precursor is not especially restricted, but weight average molecular weight of from 5,000 to 100,000 is preferred. Molecular weight can be measured by gel permeation chromatography and computed as standard polystyrene equivalent.

[2] Quinonediazide Photosensitizer:

Quinonediazide photosensitizer is not especially restricted and known quinonediazide photosensitizers can be used.

o-Quinonediazide photosensitizers can be obtained, e.g., by the condensation reaction of o-quinonediazidesulfonyl chlorides with a hydroxyl compound or an amino compound in the presence of a dehydrochlorinating agent.

As the o-quinonediazidesulfonyl chlorides, e.g., benzoquinone-1,2-diazide-4-sulfonyl chloride, naphthoquinone-1,2-diazide-5-sulfonyl chloride, and naphthoquinone-1,2-diazide-4-sulfonyl chloride can be used.

As the hydroxyl compounds, e.g., hydroquinone, resorcinol, pyrogallol, bisphenol A, bis(4-hydroxyphenyl)-methane, 2,2-bis(4-hydroxyphenyl)hexafluoropropane, 2,3,4-trihydroxybenzophenone, 2,3,4,4'-tetrahydroxybenzophenone, 2,2',4,4'-tetrahydroxybenzophenone, 2,3,4,2',3'-penta-hydroxybenzophenone, 2,3,4,3',4',5'-hexahydroxybenzophenone, bis(2,3,4-trihydroxyphenyl)methane, bis(2,3,4-trihydroxy-phenyl)propane, 4b,5,9b,10-tetrahydro-1,3,6,8-tetrahydroxy-5,10-dimethylindeno[2,1-a]indene, tris(4-hydroxyphenyl)-methane, tris (4-hydroxyphenyl)ethane and the like can be used.

As the amino compounds, e.g., p-phenylenediamine, m-phenylenediamine, 4,4'-diaminodiphenyl ether, 4,4'-diaminodiphenylmethane, 4,4'-diaminodiphenylsulfone, 4,4'-diaminodiphenyl sulfide, o-aminophenol, m-aminophenol, p-aminophenol, 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl)sulfone, bis(3-amino-4-hydroxyphenyl) hexafluoropropane, bis(4-amino-3-hydroxyphenyl) hexafluoropropane and the like can be used.

It is preferred that the o-quinonediazidesulfonyl chloride and the hydroxyl compound and/or amino compound are blended so that the sum total of the hydroxyl group and the amino group is from 0.5 to 1 equivalent to 1 mol of the o-quinonediazidesulfonyl chloride. The preferred proportion of the dehydrochlorinating agent and the o-quinonediazidesulfonyl chloride is the range of from 0.95/1 to 1/0.95. The preferred reaction temperature is from 0 to 40° C., and the preferred reaction time is from 1 to 10 hours.

As the reaction solvents, solvents such as dioxane, acetone, methyl ethyl ketone, tetrahydrofuran, diethyl ether, and N-methylpyrrolidone are used. As the dehydrochlorinating agent, sodium carbonate, sodium hydroxide, sodium hydrogencarbonate, potassium carbonate, potassium hydroxide, trimethylamine, triethylamine and pyridine are exemplified.

In the positive photosensitive resin composition in the invention, the blending amount of the quinonediazide photosensitizer is, from the points of the difference in dissolution speed between an unexposed area and an exposed area, and the tolerance of sensitivity, preferably from 5 to 100 mass parts per 100 mass parts of the PBO precursor, and more preferably from 8 to 40 mass parts.

As the quinonediazide photosensitizers, e.g., compounds having any of the following structures can be exemplified.

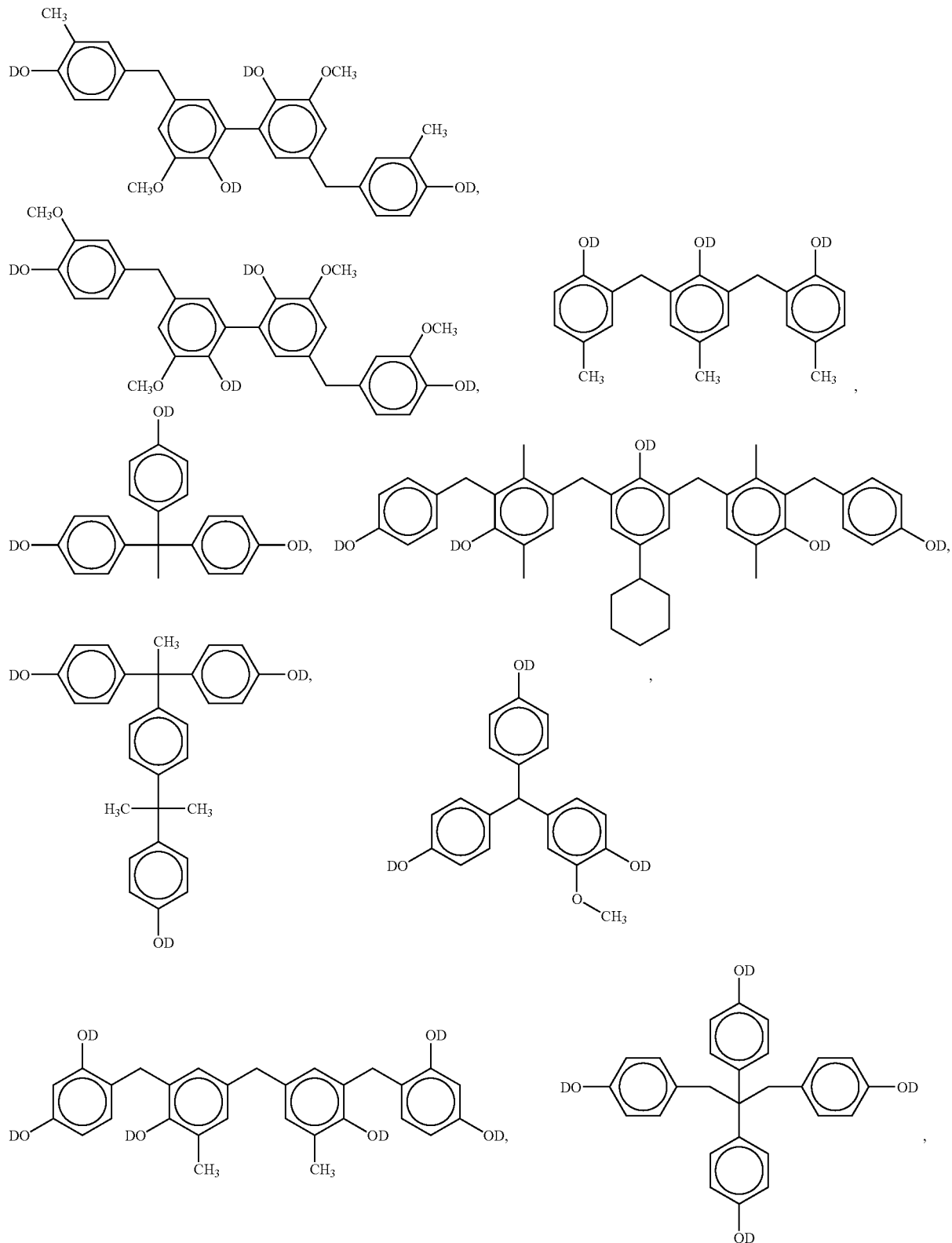

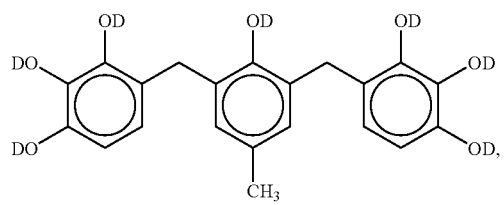
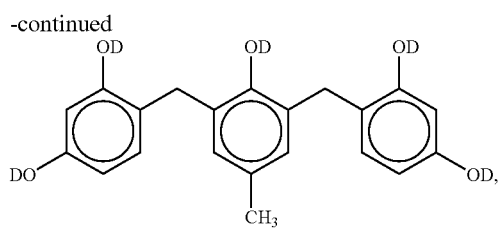
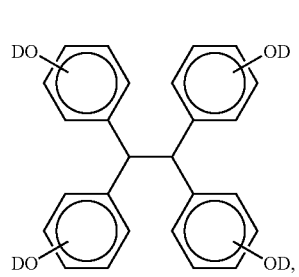
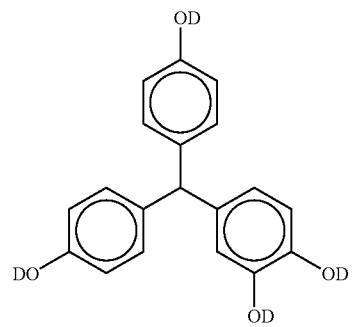

-continued

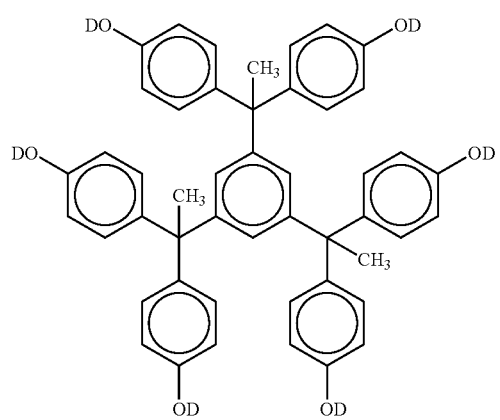

In the formulae, D represents H, or any of the following groups.

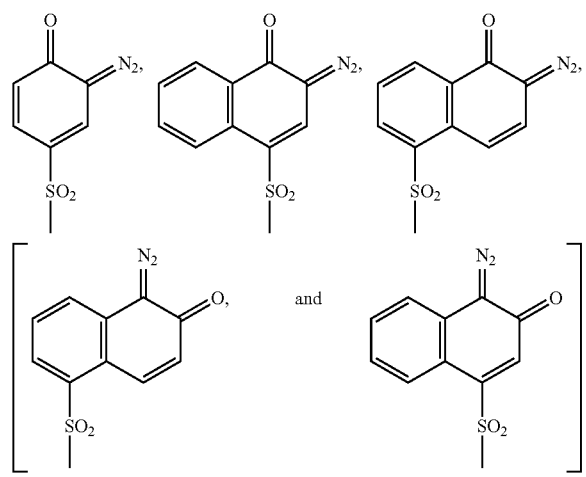

However, it is sufficient that at least one of D's in each compound is a naphthoquinonediazide group.

Commercially available quinonediazide photosensitizers may be used, or quinonediazide photosensitizers may be synthesized according to known methods.

[3] Carbonate Solvent:

The photosensitive resin composition in the invention is prepared as a solution obtained by dissolving at least a photosensitizer and a PBO precursor in a solvent containing a carbonate solvent.

As the specific examples of carbonate solvents, e.g., ethylene carbonate and propylene carbonate can be exemplified, and propylene carbonate is preferred.

The addition amount of the carbonate solvent is generally from 0.5 to 40 mass % in the photosensitive resin composition, and preferably from 1 to 30 mass %.

It is also preferred to use at least either alkyl lactate or propylene glycol monoalkyl ether in combination with the carbonate solvent.

As the specific examples of the alkyl lactates, e.g., methyl lactate and ethyl lactate are exemplified.

As the specific examples of the propylene glycol monoalkyl ethers, e.g., propylene glycol monomethyl ether, propylene glycol monoethyl ether, and propylene glycol monopropyl ether are exemplified.

The addition amount of the alkyl lactate and the propylene glycol monomethyl ether is generally from 3 to 80 mass % as a total amount in all the solvents, and preferably from 5 to 70 mass %.

Other solvents may be used in combination. As other solvents, N-methylpyrrolidone (NMP), γ-butyrolactone (GBL), N,N-dimethylacetamide (DMAc), dimethyl-2-piperidone, N,N-dimethylformamide (DMF), dimethyl sulfoxide, 2-methoxy-ethanol, diethylene glycol diethyl ether, diethylene glycol dibutyl ether, dipropylene glycol monomethyl ether, propylene glycol monomethyl ether acetate, methyl-1,3-butylene glycol acetate, 1,3-butylene glycol acetate, cyclohexanone, cyclopentanone, and tetrahydrofuran are exemplified, but the invention is not restricted thereto.

The addition amount of other solvents is generally from 3 to 80 mass % as a total amount in all the solvents, and preferably from 5 to 70 mass %.

The concentration of all the solids content of the photosensitive resin composition (corresponding to all the solids content forming a film after drying) of the invention is generally from 15 to 50 mass %, and preferably from 25 to 45 mass %.

[4] Adhesion Accelerator:

The photosensitive resin composition in the invention may contain an adhesion accelerator. As preferred adhesion accelerators, e.g., dianhydride/DAPI/bis(3-aminopropyl)-tetramethylsiloxane (BATS) polyamidic acid copolymer, aminosilane, and mixtures of these compounds are exemplified. By the addition of dianhydride/DAPI/BATS polyamidic acid copolymer, adhesion characteristics are increased.

Dianhydride/DAPI/BATS polyamidic acid copolymer can be synthesized by the reaction of tetracarboxylic dianhydride (J), BATS diamine and DAPI diamine in a reaction solvent according to the following reaction scheme.

dimethylsilane dianhydride, butanetetracarboxylic dianhydride, 1,4,5,8-naphthalenetetracarboxylic dianhydride, and mixtures of these compounds, but the invention is not restricted thereto.

The molar ratio of DAPI/BATS is about 0.1/99.9 to 99.9/0.1, preferably about 10/90 to 40/60, and most preferably about 15/85 to 30/70.

The preferred reaction solvents are N-methyl-2-pyrrolidone (NMP), γ-butyrolactone (GBL), N,N-dimethylformamide (DMF), N,N-dimethylacetamide (DMAC), dimethyl sulfoxide (DMSO), sulforan, and diglyme. The most preferred reaction solvents are N-methyl-2-pyrrolidinone (NMP) and γ-butyrolactone (GBL).

For the reaction of dianhydride with the above-described two diamines, preferred arbitrary reaction may be used. In general, the reaction temperature is from about 10 to about 50° C. and the reaction time is about 6 to 48 hours. The molar ratio of dianhydride to diamines should be about 0.9 to 1.1/1.

The photosensitive resin composition in the invention can further contain other additives, e.g., a flattening agent, etc.

If necessary, an adhesion improver, e.g., an organic silicon compound, a silane coupling agent, or a leveling agent may be added to the photosensitive resin composition in the invention for providing an adhering property. As the examples of adhesion improvers, γ-aminopropyltrimethoxysilane, γ-aminopropyltriethoxysilane, vinyltriethoxysilane, γ-glycidoxypropyltriethoxysilane, γ-methacryloxypropyltrimethoxysilane, urea propyltriethoxysilane, tris(acetyl-acetonato) aluminum, acetylacetatoaluminum diisopropylate are exemplified. When an adhesion improver is used, the addition amount is preferably from 0.1 to 20 mass parts per 100 mass parts of the PBO precursor, and more preferably from 0.5 to 10 mass parts.

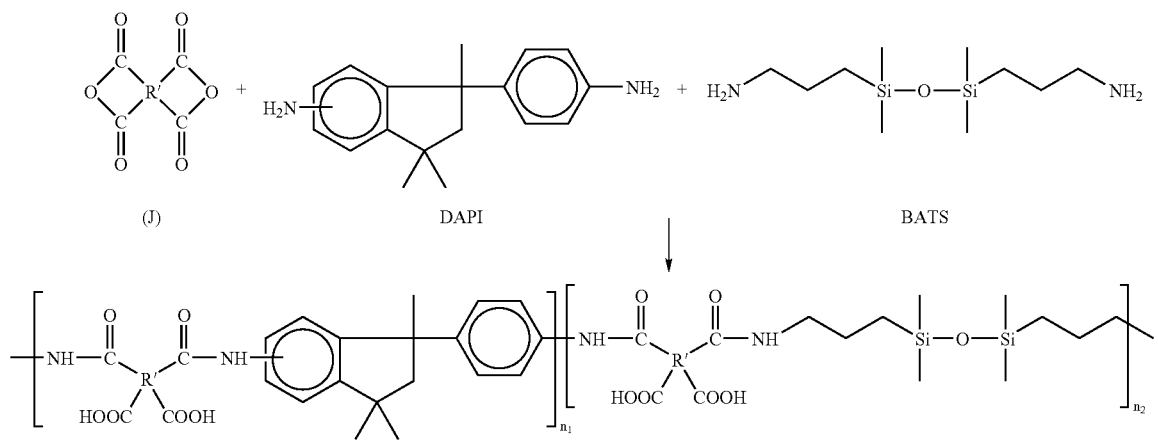

In the above formula, R' represents a tetravalent group.

Tetracarboxylic dianhydride (J) may be pyromellitic dianhydride (PMDA), 3,3',4,4'-benzophenonetetracarboxylic dianhydride, 3,3',4,4'-biphenyltetracarboxylic dianhydride, 3,3',4,4'-diphenylsulfonetetracarboxylic dianhydride, 4,4'-perfluoroisopropylidynediphthalic dianhydride, 4,4'-oxydiphthalic dianhydride, bis(3,4-dicarboxyl)-tetramethyldisiloxane dianhydride, bis(3,4-dicarboxyl-phenyl)

[5] Pattern-Forming Method:

A method of forming a relief pattern with the photosensitive resin composition of the invention comprises (a) coating the photosensitive resin composition containing a polyamide resin, a photosensitizer and a solvent on an appropriate substrate, (b) baking the coated substrate, (c) irradiating the baked substrate with actinic ray or radiation, (d) developing the exposed substrate with an aqueous developer, and (e) curing, whereby a cured relief pattern can be formed.

The coated and exposed substrate can also be baked at high temperature prior to development. Further, the developed substrate may be rinsed before curing.

Thus, a semiconductor device can be manufactured with the photosensitive resin composition of the invention by coating the composition on a substrate element, prebaking, exposing, developing, and heat curing, so as to reach a prescribed thickness after heat curing (e.g., from 0.1 to 30 µm).

A method of forming a relief pattern is described in detail below.

The photosensitive resin composition of the invention is coated on a preferred substrate. The substrate is, e.g., semiconductor materials such as a silicon wafer, a ceramic substrate, glass, metal, or plastics. The coating methods include spray coating, rotary coating, offset printing, roller coating, screen printing, extrusion coating, meniscus coating, curtain coating, and immersion coating, but the invention is not restricted thereto.

For volatilizing the remaining solvent, the coated film is previously subjected to baking at high temperature of about 70 to 120° C. for several minutes to half an hour, according to the method. In the next place, the obtained dried film is subjected to exposure through a mask of a preferred pattern with actinic ray or radiation. As the actinic ray or radiation, X-ray, electron beam, UV-ray, and visible ray can be used. The most preferred radiations are the radiations having wavelength of 436 nm (g-line) and 365 nm (i-line).

It is advantageous to heat the coated and exposed substrate at about 70 to 120° C. subsequent to exposure with actinic ray or radiation. The coated and exposed substrate is heated for a short period of time, generally from several seconds to several minutes within the range of the temperature. This step is in general technically called post-exposure baking.

In the next place, the coated film is developed with an aqueous developer to thereby form a relief pattern. As the aqueous developers, alkali solutions, e.g., inorganic alkali (e.g., potassium hydroxide, sodium hydroxide, aqueous ammonia), primary amine (e.g., ethylamine, n-propylamine), secondary amine (e.g., diethylamine, di-n-propylamine), tertiary amine (e.g., triethylamine), alcohol amine (e.g., triethanolamine), quaternary ammonium salt (e.g., tetramethylammonium hydroxide, tetraethylamonium hydroxide), and mixtures of these compounds are exemplified. The most preferred developers are those containing tetramethylammonium hydroxide. A proper amount of a surfactant may be added to the developer. For the development, immersion, spraying, paddling, or other similar development methods can be used.

According to circumstances, the relief pattern is then rinsed with deionized water. Subsequently, the relief pattern is cured for obtaining a final pattern of highly heat resisting polymer, whereby an oxazole ring is formed. Curing is carried out by baking the substrate at the glass transition temperature Tg of the polymer so as to obtain an oxazole ring forming a highly heat resisting final pattern. In general, temperature of higher than about 200° C. is used, and preferably from about 250 to 400° C. is used.

EXAMPLE

The invention will be described more specifically.

Preparation of PBO Precursor:

Synthesis of Resin A-1:

According to the synthesis example of the polyamide resin in JP-A-2005-227654, polyamide resin A-1 was synthesized with 1,1,3-trimethyl-3-phenylindane-4',5-dicarboxylic acid and 3,3'-diamino-4,4'-dihydroxybiphenyl as the materials.

The intrinsic viscosity of the polymer measured in NMP in the concentration of 0.5 g/dL at temperature of 25° C. was 0.21 dL/g.

Synthesis of Resin A-2:

According to the synthesis example of the PBO precursor in JP-A-2005-215436, polyamide resin A-2 that is PBO precursor was synthesized with 2,2'-dimethyl-4,4'-biphenylcarboxylic acid and bis(3-amino-4-hydroxyphenyl) hexafluoropropane as the materials.

The intrinsic viscosity of the polymer measured in NMP in the concentration of 0.5 g/dL at temperature of 25° C. was 0.22 dL/g.

Synthesis of Resin A-3:

According to the example in JP-A-2001-281858, polyamide resin A-3 that is the PBO precursor of the following diamine and dicarboxylic acid was synthesized.

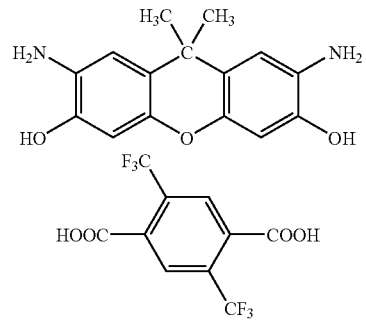

The intrinsic viscosity of the polymer measured in NMP in the concentration of 0.5 g/dL at temperature of 25° C. was 0.23 dL/g.

Synthesis of Resin A-4:

Into a three neck flask having a capacity of 100 ml were put 3.85 g (10.5 mmol) of hexafluoro-2,2-bis(3-amino-4-hydroxyphenyl)propane, 1.70 g (21 mmol) of pyridine, and 15 g of N-methyl-2-pyrrolidone (NMP). The solution was stirred at room temperature until all the solids were dissolved, and then the solution was cooled in an ice bath at 0 to 5° C. To the solution was dropped 1.48 g (5 mmol) of 1,4-oxydibenzoyl chloride dissolved in 1.02 g (5 mmol) of isophthaloyl chloride and 10 g of NMP. After termination of dropping, the obtained mixture was stirred at room temperature for 18 hours. The dense solution was thrown into 800 ml of vigorously stirred deionized water, and the precipitated white powder was recovered by filtration. The recovered reaction product was washed with a mixture of deionized water and methanol (in proportion of 50/50). The obtained polymer was dried at 40° C. for 24 hours in vacuo to obtain objective resin A-4. The yield was almost theoretical amount. The intrinsic viscosity of resin A-4 measured in NMP in the concentration of 0.5 g/dL at temperature of 25° C. was 0.28 dL/g.

Synthesis of Photosensitizer:

(1) Synthesis of Photosensitizer (B-1)

Synthesis Example 1

Into a three neck flask were put 21.6 g of phenol compound (BP-1) and 200 ml of 1,4-dioxane, and stirred until the content became homogeneous. 1,2-Naphthoquinonediazide-4-sulfonyl chloride (27 g of) was then added to the solution and dissolved. The reaction vessel was cooled to 10° C. with ice water, and 11.1 g of triethylamine was dropped to the solution over 1 hour. After termination of dropping, the reaction solution was stirred for 24 hours. After termination of the reaction, distilled water was added and the precipitated salt was dissolved, and the solution was stirred for 30 minutes. After neutralizing with dilute hydrochloric acid, the solution was crystallized with 1 liter of distilled water. The thus precipitated dark yellow powder was recovered by filtration. The recovered powder was dissolved in 200 ml of dioxane again and crystallized in 1 liter of distilled water. The product precipitated was strained, and the strained product was washed with 1 liter of distilled water, and filtered to recover 39 g of objective photosensitizer (B-1) as dark yellow powder. As a result of the analysis of the obtained (B-1) by high performance liquid chromatography (S1525, a product of Waters Corporation), the purity of esterified product of phenol compound (BP-1) was confirmed to be 98% (detection wavelength: 254 nm).

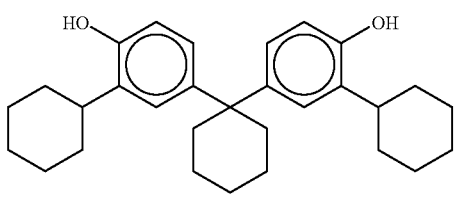

(BP-1)

(1) Synthesis of Photosensitizer (B-2):

Photosensitizer (B-2) was synthesized in the same manner as in the above synthesis example, except that the phenol compound used was changed to (BP-2) and the amount of used 1,2-naphthoquinonediazide-4-sulfonyl chloride was doubled. As a result of the analysis of the obtained (B-2) by high performance liquid chromatography (S1525, a product of Waters Corporation), the purity of esterified product of phenol compound (BP-2) was confirmed to be 97.5% (detection wavelength: 254 nm).

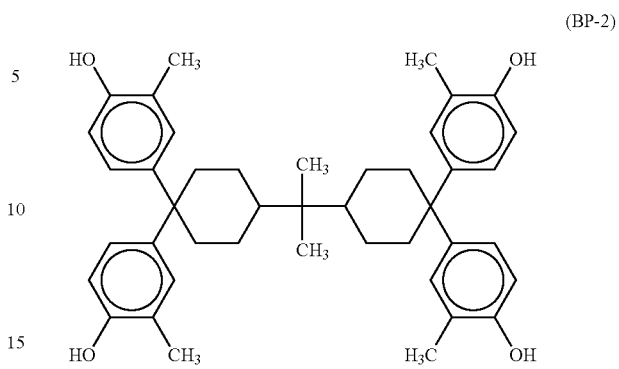

(BP-2)

(3) Preparation of Photosensitive Resin Composition:

One hundred (100) grams of a solution having solids content concentration of 40 mass % was prepared by dissolving 10 mass parts of the resin shown in Table 1 below, 2 mass parts of the photosensitizer, and 2 mass % to the resin of adhesion accelerator C shown below (alkoxysilane compound) in the solvent shown in Table 1. The prepared solution was filtered through a cassette type tetrafluoroethylene filter having a pore size of 0.2 μm to prepare a photosensitive resin composition.

Adhesion Accelerator C

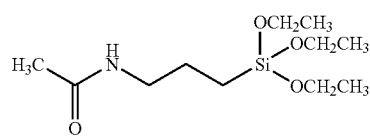

(4) Evaluation of In-Plane Uniformity (After Development):

The prepared composition was coated on a silicon wafer by spin coating and baked on a hot plate at 120° C. for 3 minutes to obtain a film having a thickness of 10 μm. The film was subjected to exposure with an i-line stepper through a mask of repeating pattern of via hole of 5 μm, development with a 0.262N tetramethylammonium hydroxide (TMAH) aqueous solution, and then rinsing with deionized water. The entire surface of the wafer of 200 mm was exposed by the exposure amount required to reproduce the pattern of via hole of 5 μm. The pattern size was measured at 30 points, and the dispersion of the sizes was expressed in 3σ.

(5) Evaluation of In-Plane Uniformity (After Heat Curing):

The wafer obtained in the above step (4) was cured by heating at 150° C. for 30 minutes under nitrogen atmosphere, and further at 300° C. for 1 hour. The pattern size of the obtained wafer was measured at 30 points, and the dispersion of the sizes was expressed in 3σ.

TABLE 1

| Example No. | Resin | Photosensitizer | Solvent | In-Plane Uniformity (after development) (μm) | In-Plane Uniformity (after heat curing) (μm) |
|---|---|---|---|---|---|
| Example 1 | A-1 | B-1 | PC/GBL = 5/95 | 0.45 | 0.55 |
| Example 2 | A-2 | B-2 | PC/GBL = 8/92 | 0.45 | 0.52 |
| Example 3 | A-3 | B-2 | PC/NMP = 7/93 | 0.45 | 0.52 |
| Example 4 | A-1 | B-1 | PC/PGME/GBL = 5/20/75 | 0.40 | 0.45 |

TABLE 1-continued

| Example No. | Resin | Photosensitizer | Solvent | In-Plane Uniformity (after development) (μm) | In-Plane Uniformity (after heat curing) (μm) |
|---|---|---|---|---|---|
| Example 5 | A-2 | B-2 | PC/PGME/NMP = 8/22/70 | 0.42 | 0.48 |
| Example 6 | A-3 | B-2 | PC/PGME/GBL = 7/23/70 | 0.40 | 0.45 |
| Example 7 | A-1 | B-2 | PC/EL/GBL = 5/25/70 | 0.40 | 0.45 |
| Example 8 | A-2 | B-1 | PC/EL/GBL = 5/20/75 | 0.40 | 0.45 |
| Example 9 | A-3 | B-2 | PC/EL/GBL = 8/20/72 | 0.38 | 0.42 |
| Example 10 | A-4 | B-1 | PC/GBL = 5/95 | 0.47 | 0.72 |
| Comparative Example 1 | A-1 | B-1 | GBL | 1.0 | 1.3 |
| Comparative Example 2 | A-2 | B-2 | NMP | 1.2 | 0.60 |
| Comparative Example 3 | A-3 | B-3 | GBL/PGME = 65/35 | 0.90 | 1.00 |
| Comparative Example 4 | A-2 | B-1 | GBL/EL = 85/15 | 0.85 | 0.95 |
| Comparative Example 5 | A-4 | B-1 | GBL | 1.1 | 1.60 |

PC: Propylene carbonate
PGME: Propylene glycol monomethyl ether
EL: Ethyl lactate
GBL: γ-Butyrolactone
NMP: N-methylpyrrolidone It is seen that the compositions in the invention are excellent in in-plane uniformity both after development and heat curing.

The photosensitive resin composition in the invention is excellent in in-plane uniformity after development and heat curing, capable of manufacturing a relief structure excellent in heat resistance, mechanical characteristics, electrical characteristics and chemical resistance based on polyamide resin, and usable for semiconductor use, in particular as a buffer coat.

The entire disclosure of each and every foreign patent application from which the benefit of foreign priority has been claimed in the present application is incorporated herein by reference, as if fully set forth.

What is claimed is:

1. A positive photosensitive resin composition, which comprises:
   a polybenzoxazole precursor;
   a quinonediazide photosensitizer; and
   a carbonate solvent.

2. The positive photosensitive resin composition according to claim 1, which further comprises at least one of alkyl lactate and propylene glycol monoalkyl ether.

3. The positive photosensitive resin composition according to claim 1,
   wherein the polybenzoxazole precursor has a structure represented by formula (A1-1):

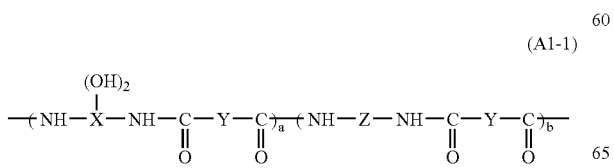

Y:

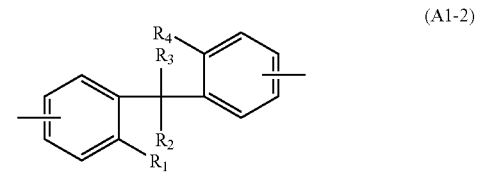

Z:

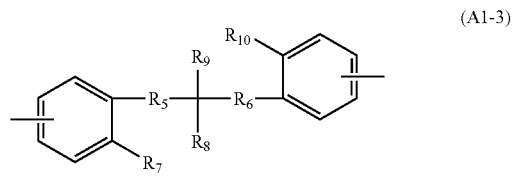

wherein X represents a tetravalent organic group represented by formula (A1-4);

Y represents a divalent organic group represented by formula (A1-2) or (A1-3);

in formulae (A1-2) and (A1-3), $R_1$, $R_2$, $R_3$ and $R_4$ each independently represents a hydrogen atom or an organic group having from 1 to 4 carbon atoms, at least one pair of $R_1$ and $R_2$, and $R_3$ and $R_4$, may form a cyclic structure by a combination of a divalent organic group having from 1 to 4 carbon atoms that may contain a group selected from —O—, —S— and >C═O, and the cyclic structure formed by $R_1$ and $R_2$ and the cyclic structure formed by $R_3$ and $R_4$ may be the same or different;

$R_5$ and $R_6$ each independently represents a group selected from a divalent organic group having from 1 to 3 carbon atoms, —O— and —S—;

$R_7$, $R_8$, $R_9$ and $R_{10}$ each independently represents a hydrogen atom or an organic group having from 1 to 4 carbon atoms, at least one pair of $R_7$ and $R_8$, and $R_9$ and $R_{10}$, may form a cyclic structure by a combination of a divalent organic group having from 1 to 4 carbon atoms that may contain a group selected from —O—, —S— and >C=O, and the cyclic structure formed by $R_7$ and $R_8$ and the cyclic structure formed by $R_9$ and $R_{10}$ may be the same or different;

in the group represented by Z, $R_{11}$ and $R_{12}$ each independently represents a divalent organic group;

$R_{13}$ and $R_{14}$ each independently represents a monovalent organic group;

a and b each independently represents a molar fraction, a+b is 100 mol %, a is from 60 to 100 mol %, and b is from 0 to 40 mol %;

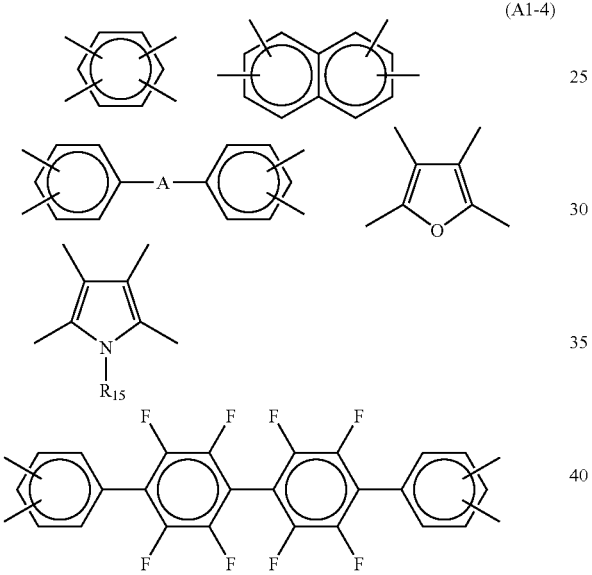

(A1-4)

in formula (A1-4), A represents a single bond, —CH$_2$—, —C(CH$_3$)$_2$—, —O—, —S—, —SO$_2$—, —CO—, —NHCO— or —C(CF$_3$)$_2$—; and $R_{15}$ represents a hydrogen atom, an alkyl group, an alkyl ester group or a halogen atom.

4. The positive photosensitive resin composition according to claim 1, wherein the polybenzoxazole precursor has a structure represented by formula (A2-1):

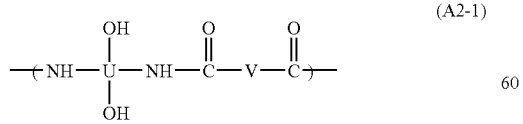

(A2-1)

wherein U represents a tetravalent organic group having an aromatic ring; and

V represents a divalent organic group, and at least one of U and V is a structure represented by formula (A2-2):

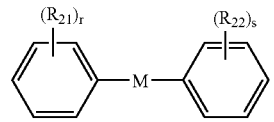

(A2-2)

wherein M represents a single bond or a divalent group;

$R_{21}$ and $R_{22}$ each independently represents a fluorine atom or a monovalent organic group;

r and s each independently represents an integer of from 1 to 4; and all the bonding hands on the structure to the amido groups or OH groups in formula (A2-1) are present on the aromatic rings.

5. The positive photosensitive resin composition according to claim 4, wherein the structure represented by formula (A2-2) is a structure represented by formula (A2-3):

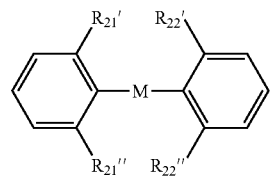

(A2-3)

wherein $R_{21}'$, $R_{21}''$, $R_{22}'$ and $R_{22}''$ each independently represents a hydrogen atom, a fluorine atom or a monovalent organic group, provided that at least one of $R_{21}'$ and $R_{21}''$ and at least one of $R_{22}'$ and $R_{22}''$ each independently represents a fluorine atom or a monovalent organic group.

6. The positive photosensitive resin composition according to claim 1, wherein the polybenzoxazole precursor has a structure represented by formula (A3-1):

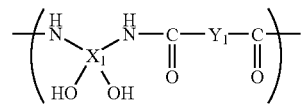

(A3-1)

wherein $X_1$ represents a tetravalent organic group having an aromatic ring;

$Y_1$ represents a divalent organic group;

two OH's and two NH's bonding to $X_1$ are each a set consists of one OH and one NH, and OH and NH in each set are positioned on ortho positions with respect to each other of the aromatic ring, and a total number of the aromatic rings contained in $X_1$ and $Y_1$ is 3 or less.

7. The positive photosensitive resin composition according to claim 6, wherein the polybenzoxazole precursor has a structure represented by formula (A3-2):

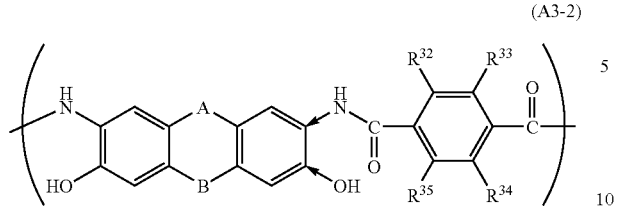

(A3-2)

wherein A and B each independently represents a divalent linking group that does not conjugate with the benzene ring to which A or B is bonded, or a single bond; $R^{32}$, $R^{33}$, $R^{34}$ and $R^{35}$ each independently represents a monovalent group, and the bonds shown by two arrows mean that the bonds may be bonded inversely.

8. The positive photosensitive resin composition according to claim 1, which further comprises an adhesion accelerator.

9. A method of manufacturing a semiconductor device, the method comprising:
   coating a photosensitive resin composition according to claim 1 on a semiconductor element, so as to form a coated semiconductor element;
   prebaking the coated semiconductor element, so as to form a prebaked semiconductor element;
   exposing and developing the prebaked semiconductor element, so as to form a relief pattern; and
   curing the relief pattern.

* * * * *